(12) United States Patent
Iwashita et al.

(10) Patent No.: US 8,304,147 B2
(45) Date of Patent: Nov. 6, 2012

(54) PHOTOMASK BLANK, PHOTOMASK, AND METHOD FOR MANUFACTURING PHOTOMASK BLANK

(75) Inventors: Hiroyuki Iwashita, Tokyo (JP); Hiroaki Shishido, Tokyo (JP); Atsushi Kominato, Tokyo (JP); Masahiro Hashimoto, Tokyo (JP)

(73) Assignee: Hoya Corporation, Tokyo (JP)

( * ) Notice: Subject to any disclaimer, the term of this patent is extended or adjusted under 35 U.S.C. 154(b) by 162 days.

(21) Appl. No.: 12/935,517

(22) PCT Filed: Mar. 31, 2009

(86) PCT No.: PCT/JP2009/056608
§ 371 (c)(1),
(2), (4) Date: Nov. 22, 2010

(87) PCT Pub. No.: WO2009/123170
PCT Pub. Date: Oct. 8, 2009

(65) Prior Publication Data
US 2011/0104592 A1    May 5, 2011

Related U.S. Application Data

(60) Provisional application No. 61/041,193, filed on Mar. 31, 2008.

(51) Int. Cl.
*G03F 1/20* (2012.01)

(52) U.S. Cl. .......................................................... 430/5

(58) Field of Classification Search .............. 430/5, 322; 428/428, 430
See application file for complete search history.

(56) References Cited

U.S. PATENT DOCUMENTS

| 2001/0044054 A1 | 11/2001 | Kaneko et al. |
| 2007/0020534 A1 | 1/2007 | Yoshikawa et al. |

FOREIGN PATENT DOCUMENTS

| JP | 59-119353 A | 7/1984 |
| JP | 4-9847 A | 1/1992 |
| JP | 2001-305713 A | 11/2001 |
| JP | 2007-33470 A | 2/2007 |

*Primary Examiner* — Stephen Rosasco
(74) *Attorney, Agent, or Firm* — Sughrue Mion, PLLC

(57) ABSTRACT

The present invention provides a photomask blank used for producing a photomask to which an ArF excimer laser light is applied, wherein: a light-shielding film is provided on a light transmissive substrate; the light-shielding film has a laminated structure in which a back-surface antireflection layer, a light-shielding layer and a front-surface antireflection layer are laminated in this order from the side close to the light transmissive substrate; the thickness of the entire light-shielding film is 60 nm or less; the back-surface antireflection layer is made of a film containing a metal and has a first etching rate; the front-surface antireflection layer is made of a film containing a metal and has a third etching rate; the light-shielding layer is made of a film containing the same metal as that contained in the back-surface antireflection layer or the front-surface antireflection layer and has a second etching rate that is lower than the first etching rate and the third etching rate; and the thickness of the light-shielding layer is 30% or less of the thickness of the entire light-shielding film.

15 Claims, 1 Drawing Sheet

PHOTOMASK BLANK, PHOTOMASK, AND METHOD FOR MANUFACTURING PHOTOMASK BLANK

CROSS REFERENCE TO RELATED APPLICATIONS

This application is a National Stage of International Application No. PCT/JP2009/056608 filed on Mar. 31, 2009, which is based on Provisional Patent Application No. 61/041,193 filed Mar. 31, 2008, the contents of all of which are incorporated herein by reference in their entirety.

TECHNICAL FIELD

The present invention relates to a photomask blank, a photomask and a method for manufacturing a photomask blank.

BACKGROUND ART

In general, in the production processes of high-density semiconductor integrated circuits such as LSI, color filters for CCD (charge-coupled device) and LCD (liquid crystal display device), magnetic heads, etc., microfabrication utilizing the photolithographic technique using photomasks is performed.

In this microfabrication, a photomask, in which a light-shielding film consisting of a metal thin film such as a chromium film is generally formed on a light transmissive substrate made of quartz glass, aluminosilicate glass or the like by means of sputtering, vacuum deposition or the like to provide a photomask blank, wherein the light-shielding film is formed to have a predetermined pattern, is used.

A photomask is produced using such a photomask blank with the following processes: an exposure process in which a desired pattern exposure is applied to a resist film formed on the photomask blank; a development process in which, after the desired pattern exposure is applied to the resist film formed on the photomask blank, a developing solution is supplied thereto to dissolve portions of the resist film soluble in the developing solution, thereby forming a resist pattern; a etching process in which, using the obtained resist pattern as a mask, portions in which a light-shielding film is exposed with the resist pattern not formed are removed by etching, such as, wet etching using an etching solution consisting of a mixed aqueous solution of ceric ammonium nitrate and perchloric acid, and dry etching using chlorine gas, thereby forming a predetermined mask pattern on a light transmissive substrate; and a stripping/removing process in which the remaining resist pattern is stripped and removed.

During patterning of the light-shielding film in the etching process, the resist pattern formed on the light-shielding film must remain with a sufficient film thickness. However, when the resist film thickness is increased, the aspect ratio is increased, and this causes the problem of pattern collapsing, etc., particularly in the case where a fine pattern is to be formed. Therefore, in order to miniaturize a mask pattern formed on a photomask, it is required to decrease the thickness of a resist film formed on a photomask blank.

Regarding this point, Japanese Laid-Open Patent Publication No. 2007-33470 (Patent Document 1) discloses a photomask blank comprising a light-shielding film having a thickness of 100 nm or less, wherein the film has a structure in which the percentage of the film thickness of a chromium-based compound having a high etching rate is 70% or more to enable reduction in etching time, thereby realizing miniaturization of the resist. Specifically, Patent Document 1 discloses a photomask blank in which a semitransparent film, a CrON film, a Cr film and a CrON film are laminated on a light transmissive substrate, wherein the percentage of the thickness of the CrON film is 70% or more.

However, regarding the above-described CrON film, it is just that the optical density per unit film thickness at a wavelength of 450 nm is set, and regarding a wavelength of exposure light equal to or less than wave length of an ArF excimer laser light, no optimization has been made. In particular, in the case of hyper-NA lithography, the angle of light incidence relative to a photomask becomes shallower, and this causes the problem that a miniaturized mask pattern itself shades a transfer image (shadowing). When a light-shielding film is thick, reduction of the amount of light (deterioration of contrast) due to shadowing is highly influential. In addition, the cross-section shape is prone to vary, and this, together with shadowing, causes reduction of transfer accuracy of CD (Critical Dimension).

[Patent Document 1] Japanese Laid-Open Patent Publication No. 2007-33470

DISCLOSURE OF THE INVENTION

Problems to be Solved by the Invention

Under the above-described circumstances, a photomask blank by which a fine mask pattern can be formed is desired. In addition, a photomask blank, by which a thin resist film can be formed on a light-shielding film, wherein pattern collapsing does not easily occur and good transfer accuracy is provided as a result, is desired. Specifically, it is desired to provide a photomask having a resolution desired for a generation of hp 45 nm, hp 32 nm or beyond by reducing the thickness of the resist film and the aspect ratio of the resist pattern in order to prevent collapsing of the resist pattern.

In order to reduce the thickness of a resist film in a photomask blank, it is required to shorten the etching time (ET) of the light-shielding film, that is, to change the structure of the light-shielding film.

The etching time (ET) is determined by the etching rate (ER), the thickness of the light-shielding film (d) and the cross-section angle adjustment time (over etching time) (OET) of the light-shielding film pattern. The relationship between them is as follows:

$$ET = d/ER + OET \qquad (1)$$
$$= CET + OET$$

In formula (1), "CET" means clear etching (just etching) time, and is time required for etching of a monitor pattern (generally a several-mm-square hole pattern) to reach a substrate or a lower-layer film such as a phase shifter film.

Accordingly, it is desired to provide a photomask blank having a light-shielding film with short etching time (ET) by promoting improvement of the etching rate (ER), reduction in the thickness (d) of the light-shielding film, reduction in over etching time (OET), etc.

In order to reduce over etching time (OET), it is required to reduce variation of the cross-section shape due to loading. However, when the etching rate (ER) is too high, an under-cut occurs during over etching, whereas when the etching rate (ER) is too low, etching time (ET) becomes longer. Therefore, it is desired to provide a photomask blank in which the etching rate in the longitudinal direction (etching rate of each layer) is controlled to enable reduction in over etching time (OET) as a result.

In order to increase the etching rate (ER), it is usually required to decrease the content of metals. However, when the content of metals is kept at a low level, the optical density per unit film thickness becomes lower, and as a result, the film thickness required for the light-shielding film to obtain a predetermined optical density is increased. Therefore, it is desired to provide a photomask blank, wherein a high etching rate (ER) is provided, and wherein a light-shielding film has a relatively low film thickness by which a sufficient optical density is provided.

Moreover, it is desired to provide a photomask blank, wherein, for example, by preventing unintended etching (e.g., an under-cut), etc., the cross section of the light-shielding film formed after etching is perpendicular to a substrate regardless of the pattern density, and wherein the cross section of the light-shielding film after etching is smooth.

Means for Solving the Problems

[1] A photomask blank for producing a photomask to which an ArF excimer laser light is applied, wherein:
a light-shielding film is provided on a light transmissive substrate;
the light-shielding film has a laminated structure in which a back-surface antireflection layer, a light-shielding layer and a front-surface antireflection layer are laminated in this order from the side close to the light transmissive substrate;
the thickness of the entire light-shielding film is 60 nm or less;
the back-surface antireflection layer is made of a film containing a metal and has a first etching rate;
the front-surface antireflection layer is made of a film containing a metal and has a third etching rate;
the light-shielding layer is made of a film containing the same metal as that contained in the back-surface antireflection layer or front-surface antireflection layer and has a second etching rate that is lower than the first etching rate and the third etching rate; and
the thickness of the light-shielding layer is 30% or less of the thickness of the entire light-shielding film.

[2] The photomask blank according to item [1], wherein the thickness of the light-shielding layer is 40% or less of the thickness of the back-surface antireflection layer.

[3] The photomask blank according to item [1] or [2], wherein the thickness ratio of the light-shielding layer to the front-surface antireflection layer is 1.0:0.7 to 1.0:7.0.

[4] The photomask blank according to any one of items [1] to [3], wherein the thickness of the light-shielding layer is 0.5% or more of the thickness of the entire light-shielding film.

[5] The photomask blank according to any one of items [1] to [4], wherein: the thickness of the back-surface antireflection layer is 23 to 33 nm; the thickness of the light-shielding layer is 2 to 6 nm; and the thickness of the front-surface antireflection layer is 11 to 17 nm.

[6] The photomask blank according to any one of items [1] to [5], wherein:
the optical density of the entire light-shielding film is 1.8 to 3.1;
the ratio of the optical density of the light-shielding layer to the sum of the optical densities of all the antireflection layers is 1:5 to 1:19; and the antireflection layers are made of a film containing the same metal as that contained in the light-shielding layer, N and O, wherein the sum of the content of N and the content of O is 40 to 65 atomic %.

[7] The photomask blank according to any one of items [1] to [6], wherein: the optical density per unit film thickness of the antireflection layers is 0.04 $nm^{-1}$ or less; and the optical density per unit film thickness of the light-shielding layer is 0.05 $nm^{-1}$ or more.

[8] The photomask blank according to any one of items [1] to [7], wherein:
the optical density of the back-surface antireflection layer is 1.1 to 1.3;
the optical density of the light-shielding layer is 0.1 to 0.3; and
the optical density of the front-surface antireflection layer is 0.4 to 0.6.

[9] The photomask blank according to any one of items [1] to [8], wherein:
the sum of the content of N and the content of O in the back-surface antireflection layer is 40 to 55 atomic %;
the sum of the content of N and the content of O in the light-shielding layer is 30 atomic % or less; and
the sum of the content of N and the content of O in the front-surface antireflection layer is 45 to 65 atomic %.

[10] The photomask blank according to any one of items [1] to [9], wherein:
the optical density per unit film thickness of the back-surface antireflection layer is 0.03 to 0.04 $nm^{-1}$; and
the optical density per unit film thickness of the light-shielding layer is 0.05 to 0.06 $nm^{-1}$.

[11] The photomask blank according to any one of items [1] to [10], wherein:
in the back-surface antireflection layer, the metal content is 25 to 50 atomic %, the sum of the content of N and the content of O is 35 to 65 atomic %, and the optical density is 1.1 to 1.3;
the light-shielding layer comprises the metal and N, wherein the metal content is 50 to 90 atomic %, the thickness is 2 to 6 nm, and the optical density is 0.1 to 0.3; and
in the front-surface antireflection layer, the metal content is 25 to 50 atomic %, the sum of the content of N and the content of O is 45 to 65 atomic %, and the optical density is 0.4 to 0.6.

[12] The photomask blank according to any one of items [1] to [11], wherein:
in the back-surface antireflection layer, the content of Cr is 30 to 40 atomic %, the sum of the content of N and the content of O is 40 to 55 atomic %, and the optical density is 1.1 to 1.3;
in the light-shielding layer, the content of Cr is 50 to 90 atomic %, the content of N is 3 to 25 atomic %, and the optical density is 0.1 to 0.3; and
in the front-surface antireflection layer, the content of Cr is 30 to 40 atomic %, the sum of the content of N and the content of O is 50 to 60 atomic %, and the optical density is 0.4 to 0.6.

[13] The photomask blank according to any one of items [1] to [12], wherein the etching rates of the back-surface antireflection layer, the light-shielding layer and the front-surface antireflection layer have the following relationship:

Second etching rate<First etching rate≦Third etching rate

[14] The photomask blank according to any one of items [1] to [13], wherein:
a phase shifter film is provided between the light transmissive substrate and the light-shielding film; and
the thickness of the entire light-shielding film is 50 nm or less.

[15] A photomask, which is produced using the photomask blank according to any one of items [1] to [14].

Advantageous Effect of the Invention

It is possible to reduce the thickness of a light-shielding film of a photomask blank in a preferred embodiment of the present invention, and this enables reduction in clear etching time (CET), and in addition, over etching time (OET) is also reduced. In particular, in a photomask blank in a preferred embodiment of the present invention, it is possible to reduce the thickness of a light-shielding film having a structure made of a plurality of layers (particularly a three-layer structure) by providing a light-shielding layer (absorption layer) having a high content of a metal such as Cr, and this enables reduction in clear etching time (CET) and over etching time (OET).

Moreover, in a photomask blank in a preferred embodiment of the present invention, over etching time (OET) can be reduced by combining a film containing a metal (e.g., Cr) having a high etching rate (ER) (antireflection layer) with a metal-containing film having a low etching rate (ER) (absorption layer), by providing a predetermined balance between the thickness of the layer having the high etching rate (ER) and the thickness of the layer having the low etching rate (ER), and by disposing the layer having the low etching rate (ER) at a predetermined position.

In a photomask blank in a preferred embodiment of the present invention, the thickness of a resist formed on a light-shielding film can be reduced by reducing clear etching time (CET), over etching time (OET) or both of them. As a result, in the photomask blank in the preferred embodiment of the present invention, the problem of pattern collapsing, etc. is not easily caused, and therefore, a fine mask pattern can be formed thereby.

Moreover, in a preferred embodiment of the present invention, by providing a structure in which a plurality of layers having a different metal content with a predetermined thickness are laminated, it is possible to provide a photomask blank comprising a light-shielding film having a predetermined thickness by which a sufficient optical density can be provided, wherein the etching rate (ER) of the entire light-shielding film is high.

EXPLANATIONS OF LETTERS OR NUMERALS

Figure 1:
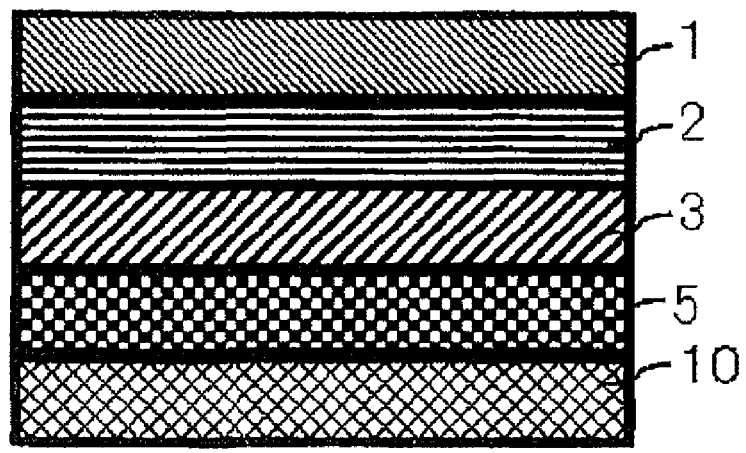
FIG. 1 shows a diagram of a photomask blank produced in Example 1.

1 . . . front-surface antireflection layer
2 . . . light-shielding layer
3 . . . back-surface antireflection layer
5 . . . phase shifter film
10 . . . light transmissive substrate

BEST MODE FOR CARRYING OUT THE INVENTION

The photomask blank of the present invention has a light-shielding film on a light transmissive substrate. Specifically, in the photomask blank of the present invention, the light-shielding film may be directly provided on the light transmissive substrate. Alternatively, other films such as a phase shifter film may be provided between the light-shielding film and the light transmissive substrate.

Further, the photomask blank of the present invention includes a photomask blank in which a resist film is formed and a photomask blank in which a resist film is not formed.

1. First Embodiment

At the time of processing a light-shielding film formed on a light transmissive substrate, the present inventors found the following matters:
(1) in the case of a two-layer structure made of a light-shielding layer and a front-surface antireflection layer, when the light-shielding layer that is a lower layer is formed with a material having a low etching rate, longer over etching time is required, and as a result, the total etching time is increased, whereas when the lower layer is formed with a material having a high etching rate, clear etching time is reduced, but there is a case where over etching time is increased due to loading, and thus, it is difficult to reduce etching time when using the two-layer structure;
(2) in order to reduce over etching time, it is preferred to employ a three-layer structure made of a back-surface antireflection layer, a light-shielding layer and a front-surface antireflection layer, wherein a material having an etching rate higher than that of the light-shielding layer is used for the back-surface antireflection layer that is the lowermost layer; and
(3) in the case of using the three-layer structure, in order to reduce over etching time and to improve the cross-section shape of the light-shielding film pattern, the thickness of the interlayer having a low etching rate is preferably adjusted to 30% or less of the entire film thickness. Thus, the invention of the photomask blank of the first embodiment was achieved.

The photomask blank of the first embodiment of the present invention used for producing a photomask to which an ArF excimer laser light is applied is a photomask blank, wherein:
a light-shielding film is provided on a light transmissive substrate;
the light-shielding film has a laminated structure in which a back-surface antireflection layer, a light-shielding layer and a front-surface antireflection layer are laminated in this order from the side close to the light transmissive substrate;
the thickness of the entire light-shielding film is 60 nm or less;
the back-surface antireflection layer is made of a film containing a metal and has a first etching rate;
the front-surface antireflection layer is made of a film containing a metal and has a third etching rate;
the light-shielding layer is made of a film containing the same metal as that contained in the back-surface antireflection layer or the front-surface antireflection layer and has a second etching rate that is lower than the first etching rate and the third etching rate; and
the thickness of the light-shielding layer is 30% or less of the thickness of the entire light-shielding film.

1.1. Light Transmissive Substrate

The light transmissive substrate is not particularly limited as long as it is a substrate that is light-transmissive. Examples thereof include a quartz glass substrate, an aluminosilicate glass substrate, a calcium fluoride substrate, and a magnesium fluoride substrate. Among them, the quartz glass substrate is preferred, because it has a high flatness level and a high smoothness level, and because, when transferring a pattern to a semiconductor substrate using a photomask, distortion of a transfer pattern does not easily occur and it is possible to perform pattern transfer with high accuracy.

1.2. Light-Shielding Film

The light-shielding film in the photomask blank of the first embodiment of the present invention has a laminated structure in which a back-surface antireflection layer, a light-shielding layer and a front-surface antireflection layer are laminated in this order from the side close to the light transmissive substrate. It is sufficient when the light-shielding film has at least 3 layers, i.e., the back-surface antireflection layer, the light-shielding layer and the front-surface antireflection layer. Further, the light-shielding film may have another layer or other layers.

1.2.1. Constitution of Respective Layers

Among layers forming the light-shielding film, the back-surface antireflection layer is a layer provided to the downside of the light-shielding layer (the side close to the light transmissive substrate). The back-surface antireflection layer preferably has a constitution in which the light shielding property and the etching property of the light-shielding film are controlled and in addition, the antireflection function and adhesion to a phase shifter film, etc. are controlled. It is sufficient when the back-surface reflectance of the back-surface antireflection layer is suppressed to a degree in which there is no influence on transfer properties by reflecting an exposure light incident from the light transmissive substrate opposite to the side on which the light-shielding film is formed by the back-surface antireflection layer to the side of an exposure light source. The back-surface reflectance with respect to a wavelength of an ArF excimer laser light is 40% or less, preferably 30% or less, and more preferably 20% or less.

Among the layers forming the light-shielding film, the light-shielding layer is a layer provided between the back-surface antireflection layer and the front-surface antireflection layer. The light-shielding layer controls the light shielding property and the etching property of the light-shielding film. Further, the light-shielding layer preferably has the highest light-shielding effect among the layers in the film.

Among the layers forming the light-shielding film, the front-surface antireflection layer is a layer provided to the upside of the light-shielding layer (the side far from the light transmissive substrate). The front-surface antireflection layer controls the light shielding property and the etching property of the light-shielding film, and in addition, it preferably has a constitution in which it controls chemical resistance with respect to washing of a photomask blank or photomask. Moreover, when using as a photomask, the front-surface antireflection layer exerts the effect to prevent reduction of the pattern accuracy caused because reflected light from a transferred product such as a semiconductor substrate returns to the transferred product. It is desired that the surface reflectance with respect to a wavelength of an ArF excimer laser light is 30% or less, preferably 25% or less, and more preferably 20% or less.

Regarding the photomask blank of the first embodiment, it may be impossible to obtain a sufficient optical density from the entire light-shielding film or the film thickness may increase in the following cases: in the back-surface antireflection layer, the metal content is less than 25 atomic %, or the sum of the content of N and the content of O is more than 65 atomic %; in the light-shielding layer, the metal content is less than 50 atomic %; or in the front-surface antireflection layer, the metal content is less than 25 atomic %, or the sum of the content of N and the content of O is more than 65 atomic %. Meanwhile, etching time of the light-shielding film may increase in the following cases: in the back-surface antireflection layer, the metal content is more than 50 atomic %, or the sum of the content of N and the content of O is less than 35 atomic %; in the light-shielding layer, the metal content is more than 90 atomic %; or in the front-surface antireflection layer, the metal content is more than 50 atomic %, or the sum of the content of N and the content of O is less than 45 atomic %.

Further, in the front-surface antireflection layer, if the metal content is more than 50 atomic % or the sum of the content of N and the content of O is less than 45 atomic %, the surface reflectance becomes too high. In this case, it may be impossible to obtain the surface reflectance of about 20% or less which is required with respect to an ArF excimer laser light. Meanwhile, in the front-surface antireflection layer, if the metal content is less than 25 atomic % or the sum of the content of N and the content of O is more than 65 atomic %, the quality may be reduced.

Regarding the photomask blank of the first embodiment, it may be impossible to obtain a sufficient optical density from the entire light-shielding film or the film thickness may increase in the following cases: in the back-surface antireflection layer, the content of Cr is less than 30 atomic %, or the sum of the content of N and the content of O is more than 55 atomic %; in the light-shielding layer, the content of Cr is less than 50 atomic %, or the content of N is more than 25 atomic %; or in the front-surface antireflection layer, the content of Cr is less than 30 atomic %, or the sum of the content of N and the content of O is more than 60 atomic %. Meanwhile, etching time of the light-shielding film may increase in the following cases: in the back-surface antireflection layer, the content of Cr is more than 40 atomic %, or the sum of the content of N and the content of O is less than 40 atomic %; in the light-shielding layer, the content of Cr is more than 90 atomic %, or the content of N is less than 3 atomic %; or in the front-surface antireflection layer, the content of Cr is more than 40 atomic %, or the sum of the content of N and the content of O is less than 50 atomic %.

Further, regarding the photomask blank of the first embodiment, the content of N in the light-shielding layer is preferably 3 to 25 atomic %, since a relatively high optical density can be obtained by a certain film thickness.

Regarding the photomask blank of the first embodiment, in the back-surface antireflection layer, it is preferred that the metal content is 25 to 50 atomic % and the sum of the content of N and the content of O is 35 to 65 atomic %, and it is more preferred that the content of Cr is 30 to 40 atomic % and the sum of the content of N and the content of O is 40 to 55 atomic %.

Further, in the light-shielding layer, it is preferred that metal and N are contained and the metal content is 50 to 90 atomic %, and it is more preferred that the content of N is 3 to 25 atomic % and the content of Cr is 50 to 90 atomic %.

Further, in the front-surface antireflection layer, it is preferred that the metal content is 25 to 50 atomic % and the sum of the content of N and the content of O is 45 to 65 atomic %, and it is more preferred that the content of Cr is 30 to 40 atomic % and the sum of the content of N and the content of O is 50 to 60 atomic %.

1.2.2. Thickness of Each Layer

Regarding the photomask blank of the first embodiment, etching time of the entire light-shielding film can be reduced since the thickness of the light-shielding layer, which has a lower etching rate, is 30% or less of the entire thickness. If the thickness of the light-shielding layer is more than 30% of the thickness of the entire light-shielding film, the thickness of the light-shielding film can be reduced, but the ratio of the back-surface or front-surface antireflection layer, which has a higher etching rate, is reduced, and as a result, etching time cannot be reduced. Therefore, such a thickness is not preferred.

In addition, regarding the photomask blank of the first embodiment, since the thickness of the light-shielding layer is 30% or less of the thickness of the entire light-shielding film, variation of the cross-section shape due to loading caused on the upper layer, i.e., the front-surface antireflection layer is reduced during etching of the light-shielding layer. After this process, the back-surface antireflection layer is rapidly etched at a first etching rate, and this suppresses further etching of a portion of the front-surface antireflection layer or the like which is not intended to be etched during etching of the back-surface antireflection layer. As a result, a good cross-section shape of the pattern is provided. Moreover, a better cross-section shape can be provided by optimizing the introduction position of the light-shielding layer.

Regarding the photomask blank of the first embodiment, the thickness of the light-shielding layer is preferably 20% or less, and more preferably 10% or less of the thickness of the entire light-shielding film, since etching time is further reduced and a better cross-section shape can be provided. If the interlayer, which has a lower etching rate, is thick, its etched shape is more tapered, and due to this, the etching area of the lower layer, i.e., the back-surface antireflection layer is narrowed, and as a result, the total etching time is increased. However, in the case of the photomask blank of the first embodiment, if the interlayer is thin, its etched shape is less tapered, and it is preferred since the development of etching of the lower layer is not prevented.

Further, if the light-shielding layer is thinned while the thickness of the lower layer, i.e., the back-surface antireflection layer is increased, it becomes possible to form the angle of the cross-sectional shape of a pattern to be more nearly perpendicular. In other words, in the light-shielding film, by controlling the position of the light-shielding layer, which has a low etching rate, a better cross-section shape can be obtained, and it becomes possible to improve pattern reproducibility.

Therefore, in the photomask blank of the first embodiment, the thickness of the light-shielding layer is preferably 40% or less, and more preferably 15% or less of the thickness of the back-surface antireflection layer.

If the value of the thickness ratio between the light-shielding layer and the front-surface antireflection layer exceeds 1.0/0.7, the front-surface antireflection layer becomes too thin, and therefore there is a case where it becomes impossible to provide a desired antireflection function. In addition, if the value of the thickness ratio is less than 1.0/7.0, there is a case where it becomes impossible to reduce over etching time.

Therefore, in the photomask blank of the first embodiment, the thickness ratio between the light-shielding layer and the front-surface antireflection layer is preferably 1.0:0.7 to 1.0:7.0, and more preferably 1.0:2.0 to 1.0:7.0. When the thickness ratio is within the above-described range, it is possible to suppress further etching of a portion which is not intended to be etched, and therefore a better cross-section shape is provided and pattern reproducibility can be improved.

In the photomask blank of the first embodiment, the thickness of the light-shielding layer is preferably 0.5% or more, and more preferably 3% or more of the thickness of the entire light-shielding film. There is a difference of the etching rate between a fine pattern and a relatively large pattern (micro-loading). Therefore, when the light-shielding layer is too thin, CD linearity by micro-loading is reduced, but it can be prevented by the above-described thickness.

1.3. Optical Density

In the present specification, the optical density (OD) satisfies the following relationship:

OD (Entire light-shielding film)=OD (Front-surface antireflection layer)+OD (Light-shielding layer)+ OD (Antireflection layer)

Further, in the present specification, "optical density per unit film thickness" satisfies the following relationship:

OD per unit film thickness (nm$^{-1}$)=OD of film (layer)/ Thickness of film (layer)

In the photomask blank of the first embodiment, within the range of the optical density of the entire light-shielding film of 1.8 to 3.1, the ratio of the optical density of the light-shielding layer to the sum of the optical densities of all the antireflection layers is set at 1:5 to 1:19, thereby providing a constitution in which most of the optical density of the entire light-shielding film is provided by the antireflection layers. The optical density depends on a composition and a film thickness. However, since the sum of the content of N and the content of O in the antireflection layer is set at 40 to 65 atomic %, though the film becomes relatively thick for obtaining a desired optical density, the etching rate is high. Due to this, the ratio of the thickness of the layer having a higher etching rate becomes higher, and therefore, etching time can be reduced and as a result, the resist film can be thinned.

In this regard, if a value of the ratio of the optical density of the antireflection layer to the optical density of the light-shielding layer exceeds 1/5, the etching rate of the antireflection layer becomes lower. Meanwhile, if a value of the above-described ratio is less than 1/19, the thickness of the antireflection layer becomes too thick. Further, if the sum of the content of N and the content of O in the antireflection layer exceeds 65 atomic %, the film becomes thicker. Meanwhile, if the above-described sum is less than 40 atomic %, the etching rate becomes lower.

In the photomask blank of the first embodiment, when the optical density of the back-surface antireflection layer is less than 1.1, the optical density is insufficient, and therefore, the thickness of any of the layers must be increased. Meanwhile, when the optical density exceeds 1.3, the etching rate becomes lower, and therefore, it becomes difficult to reduce the film thickness.

Further, when the optical density of the light-shielding layer is less than 0.1, the optical density of the entire light-shielding film is insufficient, and therefore, the thickness of any of the layers must be increased. In addition, since reflection by the light-shielding layer is reduced, it becomes impossible to obtain a sufficient interferential effect. As a result, the surface reflectance is increased, and a desired reflectance cannot be obtained. Further, when the optical density of the light-shielding layer exceeds 0.3, etching time is increased, and as a result, it becomes difficult to reduce the thickness of the resist film.

Moreover, when the optical density of the front-surface antireflection layer is less than 0.4, the reflectance becomes too low and the entire film thickness is increased. When the optical density exceeds 0.6, the reflectance becomes too high.

Therefore, in the photomask blank of the first embodiment, the optical density of the back-surface antireflection layer is set at 1.1 to 1.3, the optical density of the light-shielding layer is set at 0.1 to 0.3, and the optical density of the front-surface antireflection layer is set at 0.4 to 0.6. As a result, it is possible to easily obtain a light-shielding film having a desired film thickness, etching rate and optical properties.

Specifically, photomask blanks according to three embodiments having a light-shielding film with an optical density of 1.9 ((1) a light-shielding film with a low optical density; (2) a light-shielding film with a high optical density; and (3) a light-shielding film having a three-layer structure in which a layer with a high optical density is combined with a layer with a low optical density), will be compared to each other below.

(1) Light-Shielding Film with Low Optical Density

When forming a single-layer light-shielding film with a high ER and OD per unit film thickness=0.036 $nm^{-1}$, the thickness of the light-shielding film is 53 nm. In this case, clear etching time becomes the shortest, but over etching time becomes longer, and there is a case where it is impossible to obtain a perpendicular form.

(2) Light-Shielding Film with High Optical Density

When forming a single-layer light-shielding film with a low ER and OD per unit film thickness=0.05 $nm^{-1}$, the thickness thereof is 38 nm. In this case, clear etching time becomes the longest, and over etching time also becomes longer, and there is a case where it is impossible to obtain a perpendicular form.

(3) Light-Shielding Film Having a Three-Layer Structure in which a Layer with a High optical density is combined with a layer with a low optical density When forming a light-shielding film using the following three layers: a layer with a low optical density (OD per unit film thickness=0.039 $nm^{-1}$); a layer with a high optical density (OD per unit film thickness=0.05 $nm^{-1}$); and a layer with a low optical density (OD per unit film thickness=0.036 $nm^{-1}$), it can be realized by, for example, setting thicknesses of the layers at 30 nm, 4 nm and 14 nm, respectively. In this case, its clear etching time has a length that is approximately intermediate between that of the light-shielding film of item (1) above and that of the light-shielding film of item (2) above, and over etching time is optimized.

In view of the above-described point, it is understood that etching time can be reduced by a light-shielding layer in which a layer with a high optical density is combined with a layer with a low optical density. This can realize reduction of the thickness of the resist film, improvement of the cross-section shape and reduction of CD variation due to loading.

1.4. Etching Rate

The photomask blank of the first embodiment has a second etching rate (etching rate of the light-shielding layer), which is lower than a first etching rate (etching rate of the back-surface antireflection layer) and a third etching rate (etching rate of the front-surface antireflection layer). The etching rate can be increased by, for example, inclusion of oxygen in a metal film.

2. Second Embodiment

When oxygen is included in a metal-containing layer which constitutes a light-shielding film, the etching rate is increased, but the optical density per unit film thickness is decreased, and as a result, the thickness of the light-shielding layer is increased. Further, in the case of a film having a single speed in which there is no difference of etching rate in the longitudinal direction, variation of the cross-section shape due to loading tends to easily occur.

Further, in the case of a photomask exposed to an ArF excimer laser light, it preferably has a structure having a back-surface antireflection layer and a front-surface antireflection layer in order to prevent reduction of the pattern accuracy caused because reflected light from a transferred product such as a semiconductor substrate returns to the transferred product. However, in the case where a light-shielding film having such a laminated structure is designed with the limitation in which the thickness of the film is limited to a certain value (e.g., 60 nm or less), if the thickness of the light-shielding layer becomes thicker, it is required to decrease the thickness of the back-surface or front-surface antireflection layer, but optical properties, such as light-shielding property and reflectance, of the entire film cannot be retained only by such decrease of the thickness of the layer.

Therefore, in the second embodiment of the present invention, a photomask blank used for producing a photomask to which an ArF excimer laser light is applied is characterized in that:

a light-shielding film is provided on a light transmissive substrate;

the light-shielding film has a laminated structure in which a back-surface antireflection layer, a light-shielding layer and a front-surface antireflection layer are laminated in this order from the side close to the light transmissive substrate;

the thickness of the entire light-shielding film is 60 nm or less; the back-surface antireflection layer is made of a film containing a metal and has a first etching rate;

the front-surface antireflection layer is made of a film containing a metal and has a third etching rate; and the light-shielding layer is made of a metallic nitride film, which contains the same metal as that contained in the back-surface antireflection layer or the front-surface antireflection layer and nitrogen, and has a second etching rate that is lower than the first etching rate and the third etching rate.

When a metal is nitrided, change of a crystal structure or reduction of a film density occurs. Therefore, in the case of the photomask blank of the second embodiment in which the light-shielding layer is a metallic nitride film, when compared to the case of a pure metallic film, the tensile stress can be more relaxed and the film stress may be more easily controlled.

In the photomask blank of the second embodiment, by using a metallic nitride film having a low etching rate as the light-shielding layer, the thickness of the light-shielding film can be reduced with the optical density being kept at a high level. This enables easy design of a light-shielding film having a laminated structure and desired optical properties with the entire film thickness being limited to a certain value, and as a result, reduction of the thickness of the resist film can be realized.

In addition, in the case of the photomask blank of the second embodiment, since the second etching rate of the metallic nitride film is lower than the etching rates of the back-surface and front-surface antireflection layers, it can change etching in the longitudinal direction. That is, during etching of the metallic nitride film having the low etching rate, variation of the cross-section shape due to loading that occurs on the front-surface antireflection layer having the high etching rate is reduced. After the completion of etching of the light-shielding layer, the back-surface antireflection layer is rapidly etched at the first etching rate. This suppresses further etching of a portion of the front-surface antireflection layer or the like which is not intended to be etched during etching of the back-surface antireflection layer. As a result, a good cross-section shape of the pattern is provided.

3. Third Embodiment (1) In the third embodiment of the present invention, a photomask blank used for producing a photomask to which an ArF excimer laser light is applied is characterized in that:

a light-shielding film is provided on a light transmissive substrate;

the light-shielding film has a light-shielding layer and at least one antireflection layer, and the optical density of the entire light-shielding film is 1.8 to 3.1;

the ratio of the optical density of the light-shielding layer to the sum of the optical densities of all the antireflection layers is 1:5 to 1:19;

the light-shielding layer is made of a film containing a metal; and the antireflection layers is made of a film containing the same metal as that contained in the light-shielding layer, N and O, and the sum of the content of N and the content of O is 40 to 65 atomic %.

In the photomask blank of the third embodiment, within the range of the optical density of the entire light-shielding film of 1.8 to 3.1, the ratio of the optical density of the light-shielding layer to the sum of the optical densities of all the antireflection layers is set at 1:5 to 1:19, thereby providing a constitution in which most of the optical density of the entire light-shielding film is provided by the antireflection layers. The optical density depends on a composition and a film thickness. However, since the sum of the content of N and the content of O in the antireflection layer is set at 40 to 65 atomic %, though the film becomes relatively thick for obtaining a desired optical density, the etching rate is high. Due to this, the ratio of the thickness of the layer having a higher etching rate becomes higher, and therefore, etching time can be reduced and as a result, the resist film can be thinned.

In the photomask blank of the third embodiment, if a value of the ratio of the optical density of the antireflection layer to the optical density of the light-shielding layer exceeds 1/5, the etching rate of the antireflection layer becomes lower. Meanwhile, if a value of the above-described ratio is less than 1/19, the thickness of the antireflection layer becomes too thick. Further, in the photomask blank of the third embodiment, if the sum of the content of N and the content of O in the antireflection layer exceeds 65 atomic %, the film becomes thicker. Meanwhile, if the above-described sum is less than 40 atomic %, the etching rate becomes lower.

(2) In the photomask blank of the third embodiment, it is preferred that the optical density per unit film thickness of the antireflection layers is 0.04 $nm^{-1}$ or less, and that the optical density per unit film thickness of the light-shielding layer is 0.05 $nm^{-1}$ or more.

The third embodiment includes an embodiment in which:

the light-shielding film has a laminated structure in which a back-surface antireflection layer, a light-shielding layer and a front-surface antireflection layer are laminated in this order from the side close to a light transmissive substrate;

the optical density of the back-surface antireflection layer is 1.1 to 1.3;

the optical density of the light-shielding layer is 0.1 to 0.3; and the optical density of the front-surface antireflection layer is 0.4 to 0.6.

In the photomask blank of this embodiment, when the optical densities of the respective layers are within the above-described ranges, it is possible to easily obtain a light-shielding film having a desired thickness, etching rate and optical properties.

In the photomask blank of the third embodiment, when the optical density of the back-surface antireflection layer is less than 1.1, the optical density is insufficient, and therefore, the thickness of any of the layers must be increased. Meanwhile, when the optical density exceeds 1.3, the etching rate becomes lower, and therefore, it becomes difficult to reduce the film thickness.

Further, in the photomask blank of the third embodiment, when the optical density of the light-shielding layer is less than 0.1, the optical density of the entire light-shielding film is insufficient, and therefore, the thickness of any of the layers must be increased. In addition, since reflection by the light-shielding layer is reduced, it becomes impossible to obtain a sufficient interferential effect. As a result, the surface reflectance is increased, and a desired reflectance cannot be obtained. Further, when the optical density of the light-shielding layer exceeds 0.3, etching time is increased, and as a result, it becomes difficult to reduce the thickness of the resist film.

Moreover, in the photomask blank of the third embodiment, when the optical density of the front-surface antireflection layer is less than 0.4, the reflectance becomes too low and the entire film thickness is increased. When the optical density exceeds 0.6, the reflectance becomes too high.

(3) Regarding the photomask blank of the third embodiment, it includes an embodiment in which:

a light-shielding film has a laminated structure in which a back-surface antireflection layer, a light-shielding layer and a front-surface antireflection layer are laminated in this order from the side close to a light transmissive substrate;

the sum of the content of N and the content of O in the back-surface antireflection layer is 40 to 55 atomic %;

the sum of the content of N and the content of O in the light-shielding layer is 30 atomic % or less; and the sum of the content of N and the content of O in the front-surface antireflection layer is 45 to 65 atomic %.

In the photomask blank of this embodiment, when the content of N and O in each of the layers is within the predetermined range, it is possible to easily obtain a light-shielding film having a desired film thickness, etching rate and optical properties.

In the photomask blank of the third embodiment, when the sum of the content of N and the content of O in the back-surface antireflection layer is less than 40 atomic %, the etching rate becomes lower, and when the sum of the content of N and the content of O exceeds 55 atomic %, the optical density becomes lower (the film thickness is increased), and as a result, it becomes difficult to reduce the film thickness.

Further, in the photomask blank of the third embodiment, when the sum of the content of N and the content of O in the light-shielding layer exceeds 30 atomic %, the etching rate becomes lower, and as a result, it becomes difficult to reduce the film thickness.

Moreover, in the photomask blank of the third embodiment, when the sum of the content of N and the content of O in the front-surface antireflection layer is less than 45 atomic %, the etching rate becomes lower, and when the sum of the content of N and the content of O exceeds 65 atomic %, the optical density becomes lower (the film thickness is increased), and as a result, it becomes difficult to reduce the film thickness.

In the photomask blank of the third embodiment, it is preferred that the optical density per unit film thickness of the back-surface antireflection layer is 0.03 to 0.04 $nm^{-1}$, and that the optical density per unit film thickness of the light-shielding layer is 0.05 to 0.06 $nm^{-1}$.

4. Fourth Embodiment

In the fourth embodiment of the present invention, a photomask blank used for producing a photomask to which an ArF excimer laser light is applied is characterized in that:

a light-shielding film is provided on a light transmissive substrate;

the light-shielding film has a laminated structure in which a back-surface antireflection layer, a light-shielding layer and a front-surface antireflection layer are laminated in this order from the side close to the light transmissive substrate;

the back-surface antireflection layer is made of a CrOCN film, which is formed using Cr as a target in a mixed gas atmosphere comprising 45 to 65 vol % of an inert gas, 30 to 50 vol % of $CO_2$ gas and 1 to 15 vol % of $N_2$ gas;

the light-shielding layer is made of a CrN film, which is formed using Cr as a target in a mixed gas atmosphere comprising 70 to 90 vol % of an inert gas and 5 to 25 vol % of $N_2$ gas; and the front-surface antireflection layer is made of a CrOCN film, which is formed using Cr as a target in a mixed gas atmosphere comprising 40 to 60 vol % of an inert gas, 25 to 45 vol % of $CO_2$ gas and 5 to 20 vol % of $N_2$ gas.

The photomask blank of the fourth embodiment is a photomask blank having a laminated structure in which desired optical properties are provided when the film thickness is 60 nm or less.

In the photomask blank of the fourth embodiment, when forming an antireflection layer, $O_2$ gas or NO gas can be used. However, when a film having a high oxidation degree is desired to be formed, it is necessary to perform sputtering under a relatively high gas pressure in order to stabilize plasma. Therefore, a film obtained tends to be fragile, and such a film attached to the interior of a chamber is stripped and then attached to a substrate on which a film is being formed. As a result, the quality of an obtained product is prone to be reduced.

On the other hand, when using $CO_2$ gas, the oxidation degree can be controlled under a relatively low gas pressure. As a result, a film can be formed at a gas flow rate within a range in which a film does not become fragile.

Therefore, from the viewpoint of improvement of the quality of a product, in the photomask blank of the fourth embodiment, as an atmosphere gas to be used for forming a layer constituting a light-shielding film, $CO_2$ gas is preferably used.

(2) Regarding the photomask blank of the fourth embodiment, it includes an embodiment in which an inert gas for forming a back-surface antireflection layer consists of 10 to 30 vol % of Ar gas and 20 to 40 vol % of He gas and an inert gas for forming a front-surface antireflection layer consists of 10 to 30 vol % of Ar gas and 20 to 40 vol % of He gas.

Regarding the photomask blank of this embodiment, when He gas is included in an atmosphere gas, the compressive stress of an obtained layer in the case of a Cr-based light-shielding film is increased, and as a result, the film stress can be controlled. Further, He gas mainly acts only to control the film stress, and therefore it is preferred since it becomes easy to design the film stress.

5. Fifth Embodiment (1) In the fifth embodiment of the present invention, a photomask blank used for producing a photomask to which an ArF excimer laser light is applied is characterized in that:

a light-shielding film is provided on a light transmissive substrate;

the light-shielding film has a laminated structure in which a back-surface antireflection layer, a light-shielding layer and a front-surface antireflection layer are laminated in this order from the side close to the light transmissive substrate;

in the back-surface antireflection layer, the metal content is 25 to 50 atomic %, the sum of the content of N and the content of O is 35 to 65 atomic %, and the optical density is 1.1 to 1.3;

the light-shielding layer comprises the metal and N, wherein the metal content is 50 to 90 atomic %, the thickness is 2 to 6 nm, and the optical density is 0.1 to 0.3; and in the front-surface antireflection layer, the metal content is 25 to 50 atomic %, the sum of the content of N and the content of O is 45 to 65 atomic %, and the optical density is 0.4 to 0.6.

Regarding the photomask blank of the fifth embodiment, it may be impossible to obtain a sufficient optical density from the entire light-shielding film in the following cases: in the back-surface antireflection layer, the metal content is less than 25 atomic %, or the sum of the content of N and the content of O is more than 65 atomic %; in the light-shielding layer, the metal content is less than 50 atomic %; or in the front-surface antireflection layer, the metal content is less than 25 atomic %, or the sum of the content of N and the content of O is more than 65 atomic %. Meanwhile, etching time of the light-shielding film may increase in the following cases: in the back-surface antireflection layer, the metal content is more than 50 atomic %, or the sum of the content of N and the content of O is less than 35 atomic %; in the light-shielding layer, the metal content is more than 90 atomic %; or in the front-surface antireflection layer, the metal content is more than 50 atomic %, or the sum of the content of N and the content of O is less than 45 atomic %.

Further, regarding the photomask blank of the fifth embodiment, the content of N in the light-shielding layer is preferably 3 to 25 atomic %, since a relatively high optical density can be obtained by a certain film thickness.

In the light-shielding layer of the photomask blank of the fifth embodiment, the content of N is preferably 3 to 25 atomic %. Moreover, in the light-shielding layer of the photomask blank, the optical density per unit film thickness is preferably 0.05 to 0.06 $nm^{-1}$.

(2) Regarding the photomask blank of the fifth embodiment, it includes an embodiment in which:

in the back-surface antireflection layer, the content of Cr is 30 to 40 atomic %, the sum of the content of N and the content of O is 40 to 55 atomic %, and the optical density is 1.1 to 1.3;

in the light-shielding layer, the content of Cr is 50 to 90 atomic %, the content of N is 3 to 25 atomic %, and the optical density is 0.1 to 0.3; and in the front-surface antireflection layer, the content of Cr is 30 to 40 atomic %, the sum of the content of N and the content of O is 50 to 60 atomic %, and the optical density is 0.4 to 0.6.

Regarding the photomask blank of this embodiment, it may be impossible to obtain a sufficient optical density from the entire light-shielding film in the following cases: in the back-surface antireflection layer, the content of Cr is less than 30 atomic %, or the sum of the content of N and the content of O is more than 55 atomic %; in the light-shielding layer, the content of Cr is less than 50 atomic %, or the content of N is more than 25 atomic %; or in the front-surface antireflection layer, the content of Cr is less than 30 atomic %, or the sum of the content of N and the content of O is more than 60 atomic %. Meanwhile, etching time of the light-shielding film may increase in the following cases: in the back-surface antireflection layer, the content of Cr is more than 40 atomic %, or the sum of the content of N and the content of O is less than 40 atomic %; in the light-shielding layer, the content of Cr is more than 90 atomic %, or the content of N is less than 3 atomic %; or in the front-surface antireflection layer, the content of Cr is more than 40 atomic %, or the sum of the content of N and the content of O is less than 50 atomic %.

(3) Regarding the photomask blank of the fifth embodiment, it includes an embodiment in which the thickness of the light-shielding film is 60 nm or less.

(4) Further, regarding the photomask blank of the fifth embodiment, it includes an embodiment in which the thickness of the back-surface antireflection layer is 23 to 33 nm, the thickness of the light-shielding layer is 2 to 6 nm, and the thickness of the front-surface antireflection layer is 11 to 17 nm.

In the photomask blank of this embodiment, the thickness of the light-shielding film is preferably 60 nm or less. Therefore, when the thickness of the light-shielding layer constituting the light-shielding film is increased, the total thickness of the back-surface antireflection layer and the front-surface antireflection layer tends to be decreased. On the other hand, when the thickness of the light-shielding layer constituting the light-shielding film is decreased, the total thickness of the back-surface antireflection layer and the front-surface antireflection layer tends to be increased. Further, when compared to the light-shielding layer, the back-surface antireflection layer and the front-surface antireflection layer tend to have a higher etching rate and a lower optical density per unit film thickness based on properties of a composition such as metal content.

Therefore, regarding the photomask blank of the fifth embodiment, even in the case where the thickness of the light-shielding film is limited to 60 nm or less, the thickness of the back-surface antireflection layer exceeds 33 nm and the thickness of the front-surface antireflection layer exceeds 17 nm, when the thickness of the light-shielding layer is less than 2 nm, it may be impossible to obtain a sufficient optical density from the entire light-shielding film. Meanwhile, even in the case where the thickness of the light-shielding film is limited to 60 nm or less, the thickness of the back-surface antireflection layer is less than 23 nm and the thickness of the front-surface antireflection layer is less than 11 nm, when the thickness of the light-shielding layer exceeds 17 nm, etching time of the entire light-shielding film may be increased.

(5) Regarding the photomask blank of the fifth embodiment, it includes an embodiment in which the back-surface antireflection layer has a first etching rate, the front-surface antireflection layer has a third etching rate, and the light-shielding layer has a second etching rate that is lower than the first etching rate and the third etching rate.

6. Preferred Embodiments Regarding the Photomask Blanks of the First to Fifth Embodiments

6.1 Etching Rate

In the photomask blanks of the first to fifth embodiments, the relationship among the etching rates is preferably "Second etching rate<First etching rate≦Third etching rate", since the angle of the cross section of a pattern becomes close to be perpendicular. Further, "First etching rate<Third etching rate" is more preferred since the angle of the cross section of the pattern further becomes close to be perpendicular.

Further, the ratio between the third etching rate and the second etching rate is preferably 1.0:1.1 to 1.0:2.0. When the second etching rate exceeds 2.0 times the first etching rate, it causes unevenness between the section of the antireflection layer and the section of the light-shielding layer. In the case of less than 1.1 times, it becomes impossible to reduce the entire etching time. Further, it is preferred that the third etching rate is 0.67 nm/sec or more and that the second etching rate is 0.44 nm/sec or less.

6.2. Composition of Light-Shielding Film

In the photomask blanks of the first to fifth embodiments, a metal to be contained in the antireflection layers (back-surface antireflection layer, front-surface antireflection layer, etc.) or the light-shielding layer is preferably a transition metal such as Cr, Mo, W and Ta. Particularly preferred is Cr because chlorine-based and oxygen-based dry etching is performed and therefore the selectivity with a glass substrate or halftone phase shifter film is high. In addition, Cr is more preferred when compared to other metals because it enables not only dry etching but also wet etching.

In the photomask blanks of the first to fifth embodiments, it is preferred that the back-surface antireflection layer or the front-surface antireflection layer has the Cr content of 50 atomic % or less and comprises at least one of O, C and N, and that the light-shielding layer has the Cr content of 50 atomic % or more. By providing such a structure, a film having the relationship of "Second etching rate<First or third etching rate" can be easily formed.

The back-surface antireflection layer or the front-surface antireflection layer preferably consists of CrN, CrON, CrO, CrC, CrCO or CrOCN, and among them, CrOCN is particularly preferred.

Further, the light-shielding layer preferably consists of CrN, CrON, CrO, CrC, CrCO or CrOCN, and more preferably consists of CrN or CrON.

When the back-surface antireflection layer or the front-surface antireflection layer consists of CrOCN, it is preferred to employ an embodiment in which a Cr—Cr binding component and a $CrO_xN_y$ component are mixed together. Further, when the light-shielding layer consists of CrN, it is preferred to employ an embodiment in which a Cr—Cr binding component is the main component and a $CrO_xN_y$ component is in a small amount. By providing a larger amount of the $CrO_xN_y$ component, the etching rate can be accelerated.

Moreover, the back-surface antireflection layer or the front-surface antireflection layer of this embodiment preferably has a fine amorphous structure.

Further, regarding carbon, it is preferred to provide a state in which chromium carbide (Cr—C) is the main component and other components, C—C, C—O and C—N are mixed therewith.

Further, it is preferred that the back-surface antireflection layer and the front-surface antireflection layer have the same composition but a different composition ratio and film thickness. By providing such a structure, when forming the back-surface antireflection layer and the front-surface antireflection layer, the same atmosphere gas can be used, and as a result, the process of forming the light-shielding film can be simplified. In this case, it is easy to adjust the oxidation degree of the front-surface antireflection layer in order to improve the quality and to adjust the optical density of the back-surface antireflection layer to be higher and the reflectance thereof to be lower.

6.3. Optical Density of Light-Shielding Film

In the photomask blanks of the first to fifth embodiments, the optical density per unit film thickness of the light-shielding layer with respect to an ArF excimer laser light is preferably $0.05\ nm^{-1}$ or more.

6.4. Amount of Change of Flatness

In the photomask blanks of the first to fifth embodiments, the amount of change of flatness before and after the film-forming process is preferably 0.05 μm or less.

6.5. Resist Film/Etching Mask Film

In the photomask blanks of the first to fifth embodiments, a resist film having the thickness of 200 nm or less, and more preferably 150 nm or less can be provided on the light-shielding film.

Further, in the photomask blanks of the first to fifth embodiments, an etching mask film may be provided on the light-shielding film. When the light-shielding film contains Cr, in a general dry etching process, chlorine and oxygen are used as an etching gas to cause sublimation in the form of chromyl chloride. However, since the main component of the resist is carbon, the resist is very weak against oxygen plasma. By providing an etching mask film, load on the resist film can be reduced, and therefore, it is possible to reduce the thickness of the resist film to 100 nm or less. When Cr is the main component in the light-shielding film, it is preferred to form an etching mask film having a thickness of 5 to 20 nm using SiON, SiN, $SiO_2$, MoSiON, MoSiN or the like, which has a high selectivity. Further, an organic film containing 20% or more of Si having the thickness of 20 to 40 nm can also be provided as an etching mask film.

In the photomask blanks of the first to fifth embodiments, by providing an etching mask film on the light-shielding film, the thickness of a resist can be further reduced. Specifically, when the thickness of the resist is 100 nm or less, the pattern shape is significantly deteriorated, and LER (Line Edge Roughness) at the time when a mask pattern is transferred to the etching mask film is deteriorated. The present inventor found that, therefore, it is necessary to reduce the etching time of the etching mask film. Since the light-shielding film of the above-described embodiment has short etching time, the thickness of the etching mask film can be reduced, and therefore, etching time of the etching mask film can be reduced.

Further, in the photomask blanks of the first to fifth embodiments, the front-surface antireflection layer or the back-surface antireflection layer in the light-shielding film preferably has an amorphous structure, since the surface roughness thereof is small and therefore the surface roughness of the upper layer, the etching mask film can be reduced. As a result, the cross-section shape and LER at the time when the etching mask film is etched are improved. Therefore, when etching the lower layer, the light-shielding film utilizing an etching mask film pattern as a mask, it is possible to prevent deterioration of the cross-section shape and LER of the light-shielding film.

6.6. Photomask Blank, Etc. of the Present Invention

In this specification, the "photomask blank" includes a binary mask blank and a halftone phase shift mask blank, and the "photomask" includes a binary mask and a phase shift mask.

The halftone phase shift mask blank has a halftone phase shifter film between the light transmissive substrate and the light-shielding film.

In the halftone phase shift mask blank, the transmittance of the phase shifter film is preferably 2 to 40%.

Further, regarding the halftone phase shift mask blank, a photomask blank in which the thickness of the entire light-shielding film is 50 nm or less and the transmittance of the phase shifter film is 2 to 6% is preferred. Meanwhile, in order to improve resolution of a pattern to be transferred, the transmittance of the phase shifter film is preferably 7 to 20%.

When providing a phase shifter film, a material consisting of MoSiN or MoSiON is preferably used. By providing the light-shielding film of this embodiment on the phase shifter film consisting of the material, it becomes possible to improve LER of the phase shifter film pattern compared to the case of providing a conventional Cr-based light-shielding film.

Specifically, a conventional Cr-based light-shielding film has a porous columnar structure, and since LER of the Cr-based light-shielding film pattern becomes high for this reason, even though the phase shifter film has an amorphous structure, at the time of dry etching of the phase shifter film, due to LER of the Cr-based light-shielding film, LER of the phase shifter film pattern is deteriorated. However, in the preferred embodiment of the present invention, since the front-surface antireflection layer or the back-surface antireflection layer in the light-shielding film has an amorphous structure, it is possible to reduce LER of the light-shielding film pattern at the time of dry etching of the light-shielding film. As a result, at the time of dry etching of the phase shifter film utilizing the light-shielding film pattern as a mask, LER of the phase shifter film can be improved without deterioration of LER of the phase shifter film pattern.

7. Photomask and Production Method Thereof

A photomask obtained from the photomask blank of the present invention and a method for producing the same will be described below.

Firstly, a resist is applied to a photomask blank in which a light-shielding film is formed, and it is dried to obtain a resist film. It is required to select an appropriate resist corresponding to a writing apparatus to be used. For EB writing that is usually employed, a positive-type or negative-type resist having an aromatic skeleton in a polymer is preferably used, and for production of a photomask for a fine pattern in which the present invention is particularly effectively used, a chemically-amplified resist is preferably used.

The thickness of the resist film must be within a range in which a good pattern shape can be obtained and the film can function as an etching mask. In particular, when forming a fine pattern as a mask for ArF exposure, the film thickness is preferably 200 nm or less, and more preferably 150 nm or less. Note that when utilizing a two-layer resist method in which a resist comprising a silicon-based resin is combined with a lower layer comprising an aromatic resin, or a surface imaging method in which a chemically-amplified aromatic resist is combined with a silicon-based surface treatment agent, the film thickness can be further reduced. Application conditions and a drying method are suitably selected depending on the type of a resist to be used.

In order to reduce occurrence of stripping or collapsing of a fine resist pattern, a resin layer may be formed on the surface of a photomask blank before application of a resist. Further, instead of forming the resin layer, a surface treatment for decreasing surface energy on the surface of the substrate (photomask blank) may be performed before application of the resist. Examples of surface treatment methods include those in which HMDS or another organosilicon-based surface treatment agent that is commonly used in the semiconductor production processes is used to alkylsilylate the surface.

Next, regarding the photomask blank in which the resist film is formed, writing to the resist can be carried out using a method utilizing EB irradiation or a method utilizing light irradiation. In general, the method utilizing EB irradiation is preferably used to form a fine pattern. When using a chemically-amplified resist, writing is usually carried out with energy in a range of 3 to 40 $\mu C/cm^2$, and after writing, heat treatment is applied thereto and then a resist film is subjected to development treatment to obtain a resist pattern.

Using the resist pattern obtained above as an etching mask, etching is applied to a light-shielding film or a light-shielding film and other films (phase shifter film, etc.). At the time of etching, a publicly-known chlorine-based or fluorine-based dry etching can be suitably used depending on the composition of the light-shielding film (surface layer, light-shielding layer, antireflection layer, etc.) or other films.

After obtaining a light-shielding pattern by etching, the resist is stripped using a predetermined stripping solution, thereby obtaining a photomask in which the light-shielding film pattern is formed.

8. Pattern Transfer

The photomask of the present invention is especially useful as a mask to be used in a pattern transfer method in which a fine pattern with a DRAM half-pitch (hp) of 45 nm or less in a semiconductor design rule is formed by using an exposure method with a numerical aperture NA>1 and an exposure light wavelength of equal to or less than 200 nm.

The photomask blank of the present invention is especially effective in a case where it is used for forming a resist pattern with a line width of less than 100 nm on a photomask blank. A mask having an OPC structure is an example of such a photomask blank. In the OPC mask, the width of an auxiliary pattern provided around the main pattern with the object of increasing the resolution of the main pattern is the smallest. Therefore, the photomask blank of the present invention is especially useful for pattern transfer using a photomask having these patterns.

EXAMPLES

Hereinafter, the present invention will be described in more detail based on working examples, but the present invention is not limited thereto.

Example 1

Production of Photomask Blank

In this working example, a halftone phase shift mask blank, in which a phase shifter film 5 and a light-shielding film consisting of 3 layers are provided on a light transmissive substrate 10, was produced (see FIG. 1).

Firstly, on the light transmissive substrate 10 made of quartz glass having a size of 6-inch square and a thickness of 0.25 inch, a halftone phase shifter film 5 for ArF excimer laser (wavelength: 193 nm) constituted by a single layer comprising Mo, Si and N as the main components was formed (thickness: 69 nm) using a single-wafer sputtering apparatus.

As shown in Table 1, sputtering (DC sputtering) conditions are as follows:
Sputtering target: a mixed target of Mo and Si (Mo:Si=8:92 mol %)
Sputtering gas: a mixed gas atmosphere of Ar gas, $N_2$ gas and He gas (Ar: 9 sccm, $N_2$: 81 sccm, He: 76 sccm)
Gas pressure during discharge: 0.3 Pa
Applied power: 2.8 kW When the ArF excimer laser light (wavelength: 193 nm) was applied, the transmittance of the obtained phase shifter film 5 was 5.5% and the phase shift amount was about 180°.

Next, using the same sputtering apparatus as that by which the phase shifter film 5 was formed, a back-surface antireflection layer 3 consisting of CrOCN was formed (thickness: 30 nm). Sputtering (DC sputtering) conditions are shown in Table After that, using the same sputtering apparatus as that by which the back-surface antireflection layer 3 was formed, a light-shielding layer 2 consisting of CrN was formed (thickness: 4 nm). Sputtering (DC sputtering) conditions are shown in Table 1.

In addition, using the same sputtering apparatus as that by which the light-shielding layer 2 was formed, a front-surface antireflection layer 1 consisting of CrOCN was formed (thickness: 14 nm). Sputtering (DC sputtering) conditions are shown in Table 1.

The flow rate of the sputtering gas in Table 1 is converted into volume percentage as follows:

Front-surface antireflection layer 1: Ar=21.0 vol %, $CO_2$=36.8 vol %, $N_2$=10.5 vol %, He=31.6 vol %
Light-shielding layer 2: Ar=83.3 vol %, $N_2$=16.7 vol %
Back-surface antireflection layer 3: Ar=22.0 vol %, $CO_2$=38.9 vol %, $N_2$=5.6 vol %, He=33.3 vol %

Thus, a photomask blank, in which the phase shifter film 5, the back-surface antireflection layer 3, the light-shielding layer 2 and the front-surface antireflection layer 1 are laminated in this order on the light transmissive substrate made of quartz glass, was obtained. The optical density (OD) of the light-shielding film consisting of the back-surface antireflection layer 3, the light-shielding layer 2 and the front-surface antireflection layer 1 with respect to light having a wavelength of 193.4 nm was 1.9. Further, the optical densities of the respective layers are as shown in Table 1.

Further, compositions and atom number densities of the front-surface antireflection layer 1, the light-shielding layer 2 and the back-surface antireflection layer 3 of the obtained photomask blank were analyzed by RBS (Rutherford Backscattering Spectrometry). RBS is a technique for analyzing a surface composition relative to a surface density ($atms/cm^2$) in the depth direction. When the thickness of each layer is already-known, the atom number densities ($atms/cm^3$) can be calculated from the following formula:

Atom Number Density=Surface Density/Thickness

The atom number density of the front-surface antireflection layer 1 was calculated using the above-described technique.

As a result, the film composition of the front-surface antireflection layer 1 (thickness: 14 nm) was as follows: Cr: 34 atomic %, C: 11 atomic %, O: 39 atomic %, and N: 16 atomic %. Further, the chromium ratio in the front-surface antireflection layer 1 was as follows: C/Cr: 0.3, O/Cr: 1.2, and N/Cr: 0.5. Further, the atom number density of the front-surface antireflection layer 1 was $10.5 \times 10^{22}$ $atms/cm^3$.

Regarding the film composition of the light-shielding layer 2 (thickness: 4 nm), Cr was at least 64 atomic % or more, and N was at least 8 atomic % or more.

Further, the film composition of the back-surface antireflection layer 3 (thickness: 30 nm) was as follows: Cr: 36 atomic %, C: 15 atomic %, O: 39 atomic %, and N: 9 atomic %. Further, the chromium ratio in the back-surface antireflection layer 3 was as follows: C/Cr: 0.4, O/Cr: 1.1, and N/Cr: 0.3.

When the cross section of the obtained photomask blank was observed using a TEM (transmission electron microscope) and an X-ray diffractometer (XRD), the front-surface antireflection layer 1 had an amorphous structure in which the grain size was 1 to 2 nm. When measuring the surface roughness using an atomic force microscope (AFM), Ra=0.45 nm.

Ozone water having a concentration of 50 ppm was supplied with a flow rate of 1.4 L/minute to the surface of the substrate of the photomask blank obtained in this working example being shaken by a swing arm for 60 minutes, and changes of the thickness, surface reflectance and optical density of the light-shielding film were measured to evaluate chemical resistance.

As a result, the thickness of the light-shielding film was not changed by spraying of the ozone water. Further, change of the surface reflectance was +0.82% when using light having a wavelength of 193 nm. Change of the optical density of the light-shielding film was −0.04.

In addition, the same layer as the front-surface antireflection layer 1 of this working example was directly formed on a glass substrate by sputtering, and ozone water having a concentration of 50 ppm was sprayed on the front-surface antireflection layer 1 for 60 minutes to measure change of the reflectance. Note that in the measurement of this working example, using a spectrophotometer (Hitachi High-Technologies Corporation; U-4100), a reflection spectrum was measured before and after spraying of the ozone water, and change of the amount thereof was calculated.

As a result, changes were as follows: light having a wavelength of 193 nm: +0.7%, light having a wavelength of 257 nm: +1.5%, light having a wavelength of 365 nm: +2.0%, and light having a wavelength of 488 nm: +1.2%. As used herein, "+" represents increase of reflectance, and "−" represents decrease of reflectance.

Thus, it was confirmed that the light-shielding film of this working example has high chemical resistance with respect to ozone treatment.

(Preparation of Photomask)

On the obtained photomask blank, a chemically-amplified positive resist for electron beam writing (exposure) (PRL009: FUJIFILM Electronic Materials Co., Ltd.) was applied using a spin coat method to provide the film thickness of 150 nm. On the formed resist film, a desired pattern was wrote using an electron beam writing device, and after that, it was subjected to the development using a predetermined developer to form a resist pattern.

Next, the light-shielding film consisting of the back-surface antireflection layer 3, the light-shielding layer 2 and the front-surface antireflection layer 1 was subjected to dry etching along the above-described resist pattern to form a light-shielding film pattern. As a dry etching gas, a mixed gas of $Cl_2$ and $O_2$ ($Cl_2:O_2=4:1$) was used.

During dry etching of the above-described light-shielding film, etching rates of the respective layers were as shown in Table 1. The clear etching time of the entire light-shielding film was 84.5 sec, and when compared to Comparative Example 1 described below, reduction in time of about 8% was confirmed. Further, when the light-shielding film pattern was subjected to cross-sectional observation using a SEM (Scanning Electron Microscopy), it was in a good state in which the angle of the cross section of the light-shielding film was perpendicular to the substrate. In addition, a perpendicular cross-section shape was obtained even when the over etching time was reduced, and it was confirmed that it is possible to provide reduction in total etching time of about 20% compared to Comparative Example 1.

Next, etching of a phase shifter film was carried out using the above-described resist pattern and light-shielding film pattern as a mask to form a phase shifter film pattern. Etching of the phase shifter film is affected by the above-described cross-section shape of the light-shielding film pattern. Since the light-shielding film pattern had the good cross-section shape, the phase shifter film pattern also had a good cross-section shape.

After that, the remaining resist pattern was stripped off, and a resist film was applied again. Then pattern exposure was carried out in order to remove an unnecessary light-shielding film pattern in the transfer area. After that, the resist film was developed to form a resist pattern. Next, wet etching was carried out to remove the unnecessary light-shielding film pattern, and the remaining resist pattern was stripped off, thereby obtaining a photomask.

The obtained photomask was subjected to resolution evaluation. The resist film had a good resolution, and the resolution of the light-shielding film pattern was less than 60 nm (corresponding to DRAM hp 32 nm).

In the halftone phase shift mask blank produced in Example 1, when the thickness of the light-shielding layer was regarded as 1, the thickness ratio of the front-surface antireflection layer was 3.5. Further, the thickness percentage of the light-shielding layer relative to the thickness of the entire light-shielding film was 8%, and the thickness percentage of the light-shielding layer relative to the thickness of the back-surface antireflection layer was 13% (see Table 2).

Example 2

Figure 2:
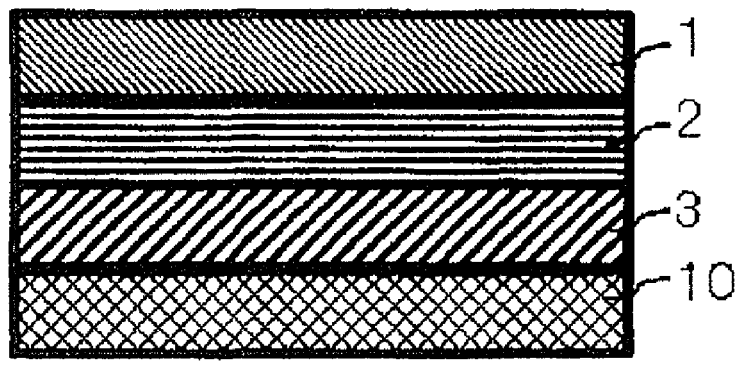
FIG. 2 shows a diagram of a photomask blank produced in Example 2.

In this working example, a binary mask blank, in which a light-shielding film consisting of 3 layers is provided on a light transmissive substrate 10, was produced (see FIG. 2).

That is, reactive sputtering was carried out under the same conditions as those in Example 1 except that the conditions of sputtering were set as shown in Table 1.

The flow rate of the sputtering gas in Table 1 is converted into volume percentage as follows:

Front-surface antireflection layer 1: Ar=21.0 vol %, $CO_2$=36.8 vol %, $N_2$=10.5 vol %, He=31.6 vol %

Light-shielding layer 2: Ar=30.8 vol %, NO=23.1 vol %, He=46.2 vol %

Back-surface antireflection layer 3: Ar=23.5 vol %, $CO_2$=29.4 vol %, $N_2$=11.8 vol %, He=35.3 vol %

Thus, a photomask blank as shown in FIG. 2, in which the back-surface antireflection layer 3, the light-shielding layer 2 and the front-surface antireflection layer 1 are laminated in this order on the light transmissive substrate 10 made of quartz glass, was obtained. The optical density (OD) of the light-shielding film consisting of the back-surface antireflection layer 3, the light-shielding layer 2 and the front-surface antireflection layer 1 with respect to light having a wavelength of 193.4 nm was 3. Further, the optical densities of the respective layers are as shown in Table 1.

Next, in the same manner as that in Example 1, the compositions of the front-surface antireflection layer 1, the light-shielding layer 2 and the back-surface antireflection layer 3 obtained and the atom number density of the front-surface antireflection layer 1 were analyzed by RBS.

As a result, the film composition of the front-surface antireflection layer 1 (thickness: 14 nm) was as follows: Cr: 32 atomic %, C: 16 atomic %, O: 37 atomic %, and N: 16 atomic %. Further, the chromium ratio in the front-surface antireflection layer 1 was as follows: C/Cr: 0.5, 0/Cr: 1.2, and N/Cr: 0.5. Further, the atom number density of the front-surface antireflection layer 1 was $11.0 \times 10^{22}$ atms/cm$^3$.

Regarding the film composition of the light-shielding layer 2 (thickness: 25 nm), Cr was 87 atomic %, O was 9 atomic % and N was 4 atomic %. Further, the chromium ratio in the light-shielding layer 2 was as follows: O/Cr: 0.1, and N/Cr: 0.05.

The film composition of the back-surface antireflection layer 3 (thickness: 25 nm) was as follows: Cr: 49 atomic %, C: 11 atomic %, O: 26 atomic %, and N: 14 atomic %. Further, the chromium ratio in the back-surface antireflection layer 3 was as follows: C/Cr: 0.2, 0/Cr: 0.5, and N/Cr: 0.3.

When the cross section of the obtained photomask blank was observed using a TEM (transmission electron microscope) and an X-ray diffractometer (XRD), the front-surface antireflection layer 1 had an amorphous structure in which the grain size was 1 to 2 nm. When measuring the surface roughness using an atomic force microscope (AFM), R=0.28 nm.

Ozone water having a concentration of 50 ppm was supplied with a flow rate of 1.4 L/minute to the surface of the substrate of the photomask blank obtained in this working example being shaken by a swing arm for 60 minutes, and changes of the thickness, surface reflectance and optical density of the light-shielding film were measured to evaluate chemical resistance.

As a result, the thickness of the light-shielding film was not changed by spraying of the ozone water. Further, change of the surface reflectance was −0.02% when using light having a wavelength of 193 nm. Change of the optical density of the light-shielding film was −0.06.

In addition, the same layer as the front-surface antireflection layer 1 of this working example was directly formed on a glass substrate by sputtering, and ozone water having a concentration of 50 ppm was sprayed on the front-surface antireflection layer 1 for 60 minutes to measure change of the reflectance in the same measurement method as that in Example 1.

As a result, changes were as follows: light having a wavelength of 193 nm: +0.5%, light having a wavelength of 257 nm: +2.1%, light having a wavelength of 365 nm: +5.3%, and light having a wavelength of 488 nm: +4.6%.

Thus, it was confirmed that the light-shielding film of this working example has high chemical resistance with respect to ozone treatment.

On the obtained photomask blank, a chemically-amplified positive resist for electron beam writing (exposure) (PRL009: FUJIFILM Electronic Materials Co., Ltd.) was applied using a spin coat method to provide the film thickness of 200 nm. On the formed resist film, a desired pattern was wrote using an electron beam writing device, and after that, it was subjected to the development using a predetermined developer to form a resist pattern.

Next, the light-shielding film consisting of the back-surface antireflection layer 3, the light-shielding layer 2 and the front-surface antireflection layer 1 was subjected to dry etching along the above-described resist pattern to form a light-shielding film pattern. As a dry etching gas, a mixed gas of $Cl_2$ and $O_2$ ($Cl_2:O_2=4:1$) was used. After that, the remaining resist pattern was stripped off, thereby obtaining a photomask.

During dry etching of the above-described light-shielding film, etching rates of the respective layers were as shown in Table 1. Further, when observing the light-shielding film pattern in a manner similar to that in Example 1, though being tapered to a certain degree, it was in a good state in which the angle of the cross section of the light-shielding film was perpendicular to the substrate. In addition, a perpendicular cross-section shape was obtained even when the over etching time was reduced, and it was confirmed that it is possible to provide reduction in total etching time of about 25% compared to Comparative Example 2.

The obtained photomask was subjected to resolution evaluation. The resist film had a good resolution, and the resolution of the light-shielding film pattern was less than 70 nm (corresponding to DRAM hp 45 nm).

Example 3

In this working example, the same binary mask blank as that in Example 2 was produced, except that the layer-forming conditions and thickness of the light-shielding layer 2 and the thickness of the back-surface antireflection layer were changed from those in Example 2.

That is, reactive sputtering was carried out under the same conditions as those in Example 2 except that the conditions of sputtering were set as shown in Table 1.

The flow rate of the sputtering gas in Table 1 is converted into volume percentage as follows:
Front-surface antireflection layer 1: Ar=21.0 vol %, $CO_2$=36.8 vol %, $N_2$=10.5 vol %, He=31.6 vol %
Light-shielding layer 2: Ar=27.2 vol %, NO=18.2 vol %, He=54.5 vol %
Back-surface antireflection layer 3: Ar=23.5 vol %, $CO_2$=29.4 vol %, $N_2$=11.8 vol %, He=35.3 vol %

Thus, a photomask blank as shown in FIG. 2, in which the back-surface antireflection layer 3, the light-shielding layer 2 and the front-surface antireflection layer 1 are laminated in this order on the light transmissive substrate 10 made of quartz glass, was obtained. The optical density (OD) of the light-shielding film consisting of the back-surface antireflection layer 3, the light-shielding layer 2 and the front-surface antireflection layer 1 with respect to light having a wavelength of 193.4 nm was 3.1. Further, the optical densities of the respective layers are as shown in Table 1.

When the cross section of the obtained photomask blank was observed using a TEM (transmission electron microscope) and an X-ray diffractometer (XRD), the front-surface antireflection layer 1 had an amorphous structure in which the grain size was 1 to 2 nm. When measuring the surface roughness using an atomic force microscope (AFM), Ra=0.28 nm.

In addition, changes of the thickness, surface reflectance and optical density of the light-shielding film were measured to evaluate chemical resistance of the photomask blank in a manner similar to that in Example 2.

As a result, the thickness of the light-shielding film was not changed by spraying of the ozone water. Further, change of the surface reflectance was −0.02% when using light having a wavelength of 193 nm. Change of the optical density of the light-shielding film was −0.06.

Thus, it was confirmed that the light-shielding film of this working example has high chemical resistance with respect to ozone treatment.

After that, a photomask was obtained in a manner similar to that in Example 2.

During dry etching of the above-described light-shielding film, etching rates of the respective layers were as shown in Table 1. Further, when observing the light-shielding film pattern in a manner similar to that in Example 1, it was in a good state in which the angle of the cross section of the light-shielding film was perpendicular to the substrate. In addition, a perpendicular cross-section shape was obtained even when the over etching time was reduced, and it was confirmed that it is possible to provide reduction in total etching time of about 25% compared to Comparative Example 2.

The obtained photomask was subjected to resolution evaluation. The resist film had a good resolution, and the resolution of the light-shielding film pattern was less than 70 nm (corresponding to DRAM hp 45 nm).

TABLE 1

| | | Film Composition | Target | Sputtering gas (sccm) | | | | | | Gas Pressure (Pa) | Applied Power (kw) | Thickness (nm) | Etching rate (nm/sec) | Optical Density |
| | | | | Ar | $CH_4$ | $CO_2$ | NO | $N_2$ | He | | | | | |
|---|---|---|---|---|---|---|---|---|---|---|---|---|---|---|
| Example 1 | Front-surface antireflection layer 1 | CrOCN | Cr | 20 | — | 35 | — | 10 | 30 | 0.2 | 1.7 | 14 | 0.67 | 0.51 |

TABLE 1-continued

| | | Film Composition | Target | Sputtering gas (sccm) | | | | | | Gas Pressure (Pa) | Applied Power (kw) | Thickness (nm) | Etching rate (nm/sec) | Optical Density |
|---|---|---|---|---|---|---|---|---|---|---|---|---|---|---|
| | | | | Ar | CH$_4$ | CO$_2$ | NO | N$_2$ | He | | | | | |
| | Light-shielding layer 2 | CrN | Cr | 25 | — | — | — | 5 | — | 0.1 | 1.7 | 4 | ≦0.44 | 0.20 |
| | Back-surface antireflection layer 3 | CrOCN | Cr | 20 | — | 35 | — | 5 | 30 | 0.2 | 1.5 | 30 | 0.44~0.67 | 1.17 |
| | Phase shifter film 5 | MoSiN | Mo + Si | 9 | — | — | — | 81 | 76 | 0.3 | 2.8 | 69 | — | — |
| Example 2 | Front-surface antireflection layer 1 | CrOCN | Cr | 20 | — | 35 | — | 10 | 30 | 0.2 | 1.8 | 14 | 0.67 | 0.51 |
| | Light-shielding layer 2 | CrON | Cr | 20 | — | — | 15 | — | 30 | 0.1 | 1.7 | 25 | ≦0.44 | 1.33 |
| | Back-surface antireflection layer 3 | CrOCN | Cr | 20 | — | 25 | — | 10 | 30 | 0.2 | 1.7 | 25 | 0.44 | 1.14 |
| Example 3 | Front-surface antireflection layer 1 | CrOCN | Cr | 20 | — | 35 | — | 10 | 30 | 0.2 | 1.8 | 14 | 0.67 | 0.51 |
| | Light-shielding layer 2 | CrON | Cr | 15 | — | — | 10 | — | 30 | 0.1 | 1.7 | 17 | ≦0.44 | 0.85 |
| | Back-surface antireflection layer 3 | CrOCN | Cr | 20 | — | 25 | — | 10 | 30 | 0.2 | 1.7 | 39 | 0.44 | 1.71 |

Comparative Example 1

In this comparative example, a halftone phase shift mask blank, which has a light-shielding film consisting of 2 layers, was produced.

Specifically, using an in-line sputtering apparatus, a light-shielding layer was formed on the same phase shifter film as that in Example 1. Sputtering (DC sputtering) conditions are as follows:
Sputtering target: Cr
Sputtering gas: a mixed gas atmosphere of Ar gas, N$_2$ gas and He gas (Ar: 30 sccm, N$_2$: sccm, He: 40 sccm)
Gas pressure during discharge: 0.2 Pa
Applied power: 0.8 kW After that, a front-surface antireflection layer was formed on the light-shielding layer. Sputtering (DC sputtering) conditions are as follows:
Sputtering target: chromium (Cr)
Sputtering gas: a gas in which a mixed gas of argon (Ar) and methane (CH$_4$) (CH$_4$: 3.5 volume %), NO and He are mixed together (Ar+CH$_4$: 65 sccm, NO: 3 sccm, He: 40 sccm)
Gas pressure during discharge: 0.3 Pa
Applied power: 0.3 kW Thus, a photomask blank having a thickness of the light-shielding film of 48 nm, in which the phase shifter film, the light-shielding layer and the front-surface antireflection layer are laminated in this order on the light transmissive substrate made of quartz glass, was obtained. The optical density (OD) of the light-shielding film consisting of the light-shielding layer and the front-surface antireflection layer with respect to light having a wavelength of 193.4 nm was 1.9.

Next, in the same manner as that in Example 1, the compositions of the front-surface antireflection layer and the light-shielding layer obtained and the atom number density of the front-surface antireflection layer were analyzed by RBS.

As a result, the film composition of the front-surface antireflection layer (thickness: 24 nm) was as follows: Cr: 34 atomic %, O: 32 atomic % and N: 23 atomic %. Further, the chromium ratio in the front-surface antireflection layer was as follows: O/Cr: 0.9, and N/Cr: 0.7. Further, the atom number density of the front-surface antireflection layer was $7.4 \times 10^{22}$ atms/cm$^3$.

The film composition of the light-shielding layer (thickness: 24 nm) was as follows: Cr: 59 atomic %, and N: 39 atomic %. Further, the chromium ratio in the light-shielding layer was as follows: N/Cr: 0.7.

Since the in-line sputtering apparatus was used, each of the light-shielding layer and the front-surface antireflection layer was a gradient film that is compositionally-graded in the thickness direction. Therefore, the above-described film compositions are averaged values.

When the cross section of the obtained photomask blank was observed using a TEM (transmission electron microscope) and an X-ray diffractometer (XRD), the front-surface antireflection layer had a low-density porous columnar structure. When measuring the surface roughness using an atomic force microscope (AFM), Ra=0.70 nm.

In addition, chemical resistance of the photomask blank obtained in this comparative example was evaluated in a manner similar to that in Example 1.

As a result, the thickness of the light-shielding film was decreased by 5.8 nm by spraying of the ozone water. Further, change of the surface reflectance was +2.72% when using light having a wavelength of 193 nm. Change of the optical density of the light-shielding film was −0.38.

In addition, the same layer as the front-surface antireflection layer of this comparative example was directly formed on a glass substrate by sputtering, and change of the amount of the reflectance was measured using the same measurement method as that in Example 1.

As a result, changes were as follows: light having a wavelength of 193 nm: +2.5% (19.8%→22.3%), light having a wavelength of 257 nm: +9.1% (16.4%→25.5%), light having a wavelength of 365 nm: +13.9% (19.9%→33.8%), and light having a wavelength of 488 nm: +11.0% (29.9%→40.9%).

Thus, it was confirmed that the light-shielding film of this comparative example had lower chemical resistance with respect to ozone treatment compared to Examples 1 and 2.

On the obtained photomask blank, a chemically-amplified positive resist for electron beam writing (exposure) was applied to provide the film thickness of 150 nm in a manner similar to that in Example 1, and a photomask was obtained in a manner similar to that in Example 1.

During dry etching of the above-described light-shielding film, the etching rate was lower than that of Example 1. The clear etching time of the entire light-shielding film was 92.0 sec. Further, when observing the light-shielding film pattern in a manner similar to that in Example 1, the angle of the cross section of the light-shielding film was not formed to be perpendicular to the substrate. For this reason, the phase shifter film pattern did not have a good cross-section shape.

The obtained photomask was subjected to resolution evaluation. The resolution of the resist film was bad, and due to etching defects, the resolution of the light-shielding film pattern was 80 nm or more.

Comparative Example 2

In this comparative example, a binary mask blank having a light-shielding film consisting of 2 layers was produced.

Specifically, using an in-line sputtering apparatus, a light-shielding layer was formed on a light transmissive substrate. Sputtering (DC sputtering) conditions are as follows:
Sputtering target: Cr
Sputtering gas: a mixed gas atmosphere of Ar gas, $N_2$ gas and He gas (Ar: 72 sccm, $N_2$: 28 sccm)
Gas pressure during discharge: 0.3 Pa
Applied power: 0.6 kW After that, a front-surface antireflection layer was formed on the light-shielding layer. Sputtering (DC sputtering) conditions are as follows:
Sputtering target: chromium (Cr)
Sputtering gas: a gas in which a mixed gas of argon (Ar) and methane ($CH_4$) ($CH_4$: 8 volume %), NO and He are mixed together (Ar+$CH_4$: 105 sccm, NO: 3 sccm)
Gas pressure during discharge: 0.3 Pa
Applied power: 1.1 kW In this way, a photomask blank having a thickness of the light-shielding film of 73 nm, in which the light-shielding layer and the front-surface antireflection layer are laminated in this order on the light transmissive substrate made of quartz glass, was obtained. The optical density (OD) of the light-shielding film consisting of the light-shielding layer and the front-surface antireflection layer with respect to light having a wavelength of 193.4 nm was 3.0.

Next, in the same manner as that in Example 1, the compositions of the front-surface antireflection layer and the light-shielding layer obtained and the atom number density of the front-surface antireflection layer were analyzed by RBS.

As a result, the film composition of the front-surface antireflection layer was as follows: Cr: 48 atomic %, and the sum of O and N: 50 atomic %. The film composition of the light-shielding layer 2 was as follows: Cr: 60 atomic %, and the sum of O and N: 30 atomic %. Since the in-line sputtering apparatus was used, each of the light-shielding layer and the front-surface antireflection layer was a gradient film that is compositionally-graded in the thickness direction. Therefore, the above-described film compositions are averaged values.

Further, when the cross section of the obtained photomask blank was observed using a TEM (transmission electron microscope) and an X-ray diffractometer (XRD), the front-surface antireflection layer had a low-density porous columnar structure. When measuring the surface roughness using an atomic force microscope (AFM), Ra=0.60 nm.

In addition, chemical resistance of the photomask blank obtained in this comparative example was evaluated in a manner similar to that in Example 1.

As a result, the thickness of the light-shielding film of the photomask blank was decreased by 4.2 nm by spraying of the ozone water. Further, change of the surface reflectance was +5.30% when using light having a wavelength of 193 nm. Change of the optical density of the light-shielding film was −2.60.

On the obtained photomask blank, a chemically-amplified positive resist for electron beam writing (exposure) was applied to provide the film thickness of 200 nm in a manner similar to that in Example 2, and a photomask was obtained in a manner similar to that in Example 2.

During dry etching of the above-described light-shielding film, the etching rate was lower than that of Example 2. Further, when observing the light-shielding film pattern in a manner similar to that in Example 1, compared to Example 2, the angle of the cross section of the light-shielding film was not formed to be perpendicular to the substrate.

The obtained photomask was subjected to resolution evaluation. The resolution of the resist film was bad, and due to etching defects, the resolution of the light-shielding film pattern was 80 nm or more.

Example 4

Example 4 is the same as Example 1, except that the thickness of the light-shielding layer was changed to be smaller and the thickness of the back-surface antireflection layer was changed to be larger compared to those in Example 1.

The structure of the halftone phase shift mask blank produced in Example 4 and the resolution and cross-section shape of the obtained halftone phase shift mask were as shown in Table 2.

Note that in Table 2, values in the column of thickness ratio show, from top down, "the thickness ratio of the front-surface antireflection layer when the thickness of the light-shielding layer is regarded as 1" (e.g., 7.0 in Example 4), "the thickness percentage (%) of the light-shielding layer relative to the thickness of the entire light-shielding film" (e.g., 4% in Example 4), and "the thickness percentage (%) of the light-shielding layer relative to the thickness of the back-surface antireflection layer" (e.g., 6% in Example 4).

Example 5

Example 5 is the same as Example 1, except that the thickness of the light-shielding layer was changed to be larger and the thickness of the back-surface antireflection layer was changed to be smaller compared to those in Example 1.

The structure of the halftone phase shift mask blank produced in Example 5 and the resolution and cross-section shape of the obtained halftone phase shift mask were as shown in Table 2.

Comparative Example 3

Comparative Example 3 is the same as Example 5, except that the thickness of the light-shielding layer was changed to be larger and the thickness of the back-surface antireflection layer was changed to be smaller compared to those in Example 5.

The structure of the halftone phase shift mask blank produced in Comparative Example 3 and the resolution of the obtained halftone phase shift mask were as shown in Table 2.

TABLE 2

| | | Cr content (atm %) | N + O content (atm %) | Thickness (nm) | Thickness ratio | OD | Resolution | Cross-section shape |
|---|---|---|---|---|---|---|---|---|
| Example 1 | TOTAL | — | — | 48 | | 1.88 | ○ | ○ |
| | TAR | CrOCN | 34 | 55 | 14 | 3.5 | 0.51 | |
| | ABS | CrN | ≧64 | ≦8 | 4 | 8 | 0.2 | |
| | BAR | CrOCN | 36 | 48 | 30 | 13 | 1.17 | |
| Example 4 | TOTAL | | — | — | 49 | | 1.9 | ○ | ○ |
| | TAR | CrOCN | 34 | 55 | 14 | 7.0 | 0.51 | |
| | ABS | CrN | ≧64 | ≦8 | 2 | 4 | 0.1 | |
| | BAR | CrOCN | 36 | 48 | 33 | 6 | 1.29 | |
| Example 5 | TOTAL | | — | — | 48 | | 1.9 | ○ | ○ |
| | TAR | CrOCN | 34 | 55 | 14 | 2.3 | 0.51 | |
| | ABS | CrN | ≧64 | ≦8 | 6 | 13 | 0.3 | |
| | BAR | CrOCN | 36 | 48 | 28 | 21 | 1.09 | |
| Comparative Example 3 | TOTAL | | — | — | 45 | | 1.91 | X | — |
| | TAR | CrOCN | 34 | 55 | 14 | 0.8 | 0.51 | |
| | ABS | CrN | ≧64 | ≦8 | 17 | 38 | 0.85 | |
| | BAR | CrOCN | 36 | 48 | 14 | 121 | 0.55 | |

TAR: front-surface antireflection layer
ABS: light-shielding layer
BAR: back-surface antireflection layer Example 6

Example 6 is the same as Example 1, except that the Cr content of the back-surface antireflection layer was changed to be smaller, the sum of the content of N and the content of O was changed to be larger, and the thickness of the light-shielding layer was changed to be larger compared to Example 1.

The structure of the halftone phase shift mask blank produced in Example 6 and the resolution and cross-section shape of the obtained halftone phase shift mask were as shown in Table 3.

Note that in Table 3, values in the column of thickness ratio show the same matters as those in Table 2.

Example 7

Example 7 is the same as Example 1, except that the Cr content of the back-surface antireflection layer was changed to be larger, the sum of the content of N and the content of O was changed to be larger, the thickness of the light-shielding layer was changed to be smaller, and the thickness of the back-surface antireflection layer was changed to be larger compared to those in Example 1.

The structure of the halftone phase shift mask blank produced in Example 7 and the resolution and cross-section shape of the obtained halftone phase shift mask were as shown in Table 3.

Comparative Example 4

Comparative Example 4 is the same as Example 7, except that the Cr content of the back-surface antireflection layer was changed to be larger, the sum of the content of N and the content of O was changed to be smaller, the thickness of the light-shielding layer was changed to be smaller, and the thickness of the back-surface antireflection layer was changed to be smaller compared to those in Example 7.

The structure of the halftone phase shift mask blank produced in Comparative Example 4 and the resolution of the obtained halftone phase shift mask were as shown in Table 3.

Comparative Example 5

Comparative Example 5 is the same as Example 6, except that the Cr content of the back-surface antireflection layer was changed to be smaller, the sum of the content of N and the content of O was changed to be larger, the thickness of the light-shielding layer was changed to be larger, and the thickness of the back-surface antireflection layer was changed to be smaller compared to those in Example 6.

The structure of the halftone phase shift mask blank produced in Comparative Example 5 and the resolution of the obtained halftone phase shift mask were as shown in Table 3.

TABLE 3

| | | | Cr content (atm %) | N + O content (atm %) | Thickness (nm) | Thickness ratio | OD | Resolution | Cross-section shape |
|---|---|---|---|---|---|---|---|---|---|
| Example 6 | TOTAL | | — | — | 50 | | 1.89 | ○ | ○ |
| | TAR | CrOCN | 34 | 55 | 14 | 2.3 | 0.51 | | |
| | ABS | CrN | ≧64 | ≦8 | 6 | 12 | 0.3 | | |
| | BAR | CrOCN | 34 | 55 | 30 | 20 | 1.08 | | |
| Example 7 | TOTAL | | — | — | 48 | | 1.9 | ○ | ○ |
| | TAR | CrOCN | 34 | 55 | 14 | 4.7 | 0.51 | | |
| | ABS | CrN | ≧64 | ≦8 | 3 | 6 | 0.15 | | |
| | BAR | CrOCN | 40 | 52 | 31 | 10 | 1.24 | | |
| Comparative Example 4 | TOTAL | | — | — | 42 | | 1.91 | X | — |
| | TAR | CrOCN | 34 | 55 | 14 | 14.0 | 0.51 | | |
| | ABS | CrN | ≧64 | ≦8 | 1 | 2 | 0.05 | | |
| | BAR | CrOCN | 62 | 30 | 27 | 4 | 1.35 | | |

TABLE 3-continued

| | | | Cr content (atm %) | N + O content (atm %) | Thickness (nm) | Thickness ratio | OD | Resolution | Cross-section shape |
|---|---|---|---|---|---|---|---|---|---|
| Comparative Example 5 | TOTAL | | — | — | 48 | | 1.89 | X | — |
| | TAR | CrOCN | 34 | 55 | 14 | 0.7 | 0.51 | | |
| | ABS | CrN | ≧64 | ≦8 | 20 | 42 | 1 | | |
| | BAR | CrOCN | 18 | 70 | 14 | 143 | 0.38 | | |

TAR: front-surface antireflection layer
ABS: light-shielding layer
BAR: back-surface antireflection layer

Example 8

Example 8 is the same as Example 1, except that the Cr content and the N content of the light-shielding layer were changed to be larger, the thickness of the light-shielding layer was changed to be smaller, and the thickness of the back-surface antireflection layer was changed to be larger compared to those in Example 1.

The structure of the halftone phase shift mask blank produced in Example 8 and the resolution and cross-section shape of the obtained halftone phase shift mask were as shown in Table 4.

Note that in Table 4, values in the column of thickness ratio show the same matters as those in Table 2.

Example 9

Example 9 is the same as Example 1, except that the Cr content and the N content of the light-shielding layer were changed to be larger compared to those in Example 1.

The structure of the halftone phase shift mask blank produced in Example 9 and the resolution and cross-section shape of the obtained halftone phase shift mask were as shown in Table 4.

Comparative Example 6

Comparative Example 6 is the same as Example 1, except that the Cr content of the light-shielding layer was changed to be smaller and the content of N was changed to be larger compared to those in Example 1.

The structure of the halftone phase shift mask blank produced in Comparative Example 6 and the resolution of the obtained halftone phase shift mask were as shown in Table 4.

In Examples 4-9 described above, the resist film had a good resolution, and the resolution of the light-shielding film pattern was less than 60 nm. In addition, the cross-section shape was perpendicular and good.

On the other hand, in Comparative Examples 3 and 5, the etching time was not reduced particularly because the light-shielding layer was too thick, and therefore, the resist had a bad resolution and the resolution of the light-shielding film pattern of 60 nm was not realized.

In Comparative Example 4, the etching time was not reduced particularly because the etching rate of the back-surface antireflection layer was low, and therefore, the resist had a bad resolution and the resolution of the light-shielding film pattern of 60 nm was not realized.

In Comparative Example 6, the speed difference was caused due to loading and the etching time was not reduced particularly because the light-shielding layer was too thin. Therefore, the resist had a bad resolution and the resolution of the light-shielding film pattern of 60 nm was not realized.

INDUSTRIAL APPLICABILITY

The photomask blank of the preferred embodiment of the present invention can suppress shadowing, and therefore can be used for high-NA lithography and can also be used for lithography using an exposure light having a short wavelength. Therefore, by using the photomask blank of the preferred embodiment of the present invention, a very fine mask pattern can be formed.

In addition, the photomask blank of the preferred embodiment of the present invention can be applied to, for example, a photomask blank of a generation of hp 45 nm, hp 32 nm or beyond in hyper-NA-ArF lithography.

TABLE 4

| | | | Cr content (atm %) | N + O content (atm %) | Thickness (nm) | Thickness ratio | OD | Resolution | Cross-section shape |
|---|---|---|---|---|---|---|---|---|---|
| Example 8 | TOTAL | | — | — | 48 | | 1.88 | ○ | ○ |
| | TAR | CrOCN | 34 | 55 | 14 | 4.7 | 0.51 | | |
| | ABS | CrN | 87 | 13 | 3 | 6 | 0.16 | | |
| | BAR | CrOCN | 36 | 48 | 31 | 10 | 1.21 | | |
| Example 9 | TOTAL | | — | — | 48 | | 1.89 | ○ | ○ |
| | TAR | CrOCN | 34 | 55 | 14 | 3.5 | 0.51 | | |
| | ABS | CrN | 70 | 25 | 4 | 8 | 0.21 | | |
| | BAR | CrOCN | 36 | 48 | 30 | 13 | 1.17 | | |
| Comparative Example 6 | TOTAL | | — | — | 50 | | 1.9 | X | — |
| | TAR | CrOCN | 34 | 55 | 14 | 14.0 | 0.51 | | |
| | ABS | CrN | 18 | 70 | 1 | 2 | 0.03 | | |
| | BAR | CrOCN | 36 | 48 | 35 | 3 | 1.37 | | |

TAR: front-surface antireflection layer
ABS: light-shielding layer
BAR: back-surface antireflection layer

The invention claimed is:

1. A photomask blank for producing a photomask to which an ArF excimer laser light is applied, wherein:
a light-shielding film is provided on a light transmissive substrate;
the light-shielding film has a laminated structure in which a back-surface antireflection layer, a light-shielding layer and a front-surface antireflection layer are laminated in this order from the side close to the light transmissive substrate;
the thickness of the entire light-shielding film is 60 nm or less;
the back-surface antireflection layer is made of a film containing a metal and has a first etching rate;
the front-surface antireflection layer is made of a film containing a metal and has a third etching rate;
the light-shielding layer is made of a film containing the same metal as that contained in the back-surface antireflection layer or the front-surface antireflection layer and has a second etching rate that is lower than the first etching rate and the third etching rate; and
the thickness of the light-shielding layer is 30% or less of the thickness of the entire light-shielding film.

2. The photomask blank according to claim 1, wherein the thickness of the light-shielding layer is 40% or less of the thickness of the back-surface antireflection layer.

3. The photomask blank according to claim 1, wherein the thickness ratio of the light-shielding layer to the front-surface antireflection layer is 1.0:0.7 to 1.0:7.0.

4. The photomask blank according to claim 1, wherein the thickness of the light-shielding layer is 0.5% or more of the thickness of the entire light-shielding film.

5. The photomask blank according to claim 1, wherein: the thickness of the back-surface antireflection layer is 23 to 33 nm; the thickness of the light-shielding layer is 2 to 6 nm; and the thickness of the front-surface antireflection layer is 11 to 17 nm.

6. The photomask blank according to claim 1, wherein:
the optical density of the entire light-shielding film is 1.8 to 3.1;
the ratio of the optical density of the light-shielding layer to the sum of the optical densities of all the antireflection layers is 1:5 to 1:19; and
the antireflection layers are made of a film containing the same metal as that contained in the light-shielding layer, N and O, wherein the sum of the content of N and the content of O is 40 to 65 atomic %.

7. The photomask blank according to claim 1, wherein: the optical density per unit film thickness of the antireflection layers is 0.04 $nm^{-1}$ or less; and the optical density per unit film thickness of the light-shielding layer is 0.05 $nm^{-1}$ or more.

8. The photomask blank according to claim 1, wherein:
the optical density of the back-surface antireflection layer is 1.1 to 1.3;
the optical density of the light-shielding layer is 0.1 to 0.3; and
the optical density of the front-surface antireflection layer is 0.4 to 0.6.

9. The photomask blank according to claim 1, wherein:
the sum of the content of N and the content of O in the back-surface antireflection layer is 40 to 55 atomic %;
the sum of the content of N and the content of O in the light-shielding layer is 30 atomic % or less; and
the sum of the content of N and the content of O in the front-surface antireflection layer is 45 to 65 atomic %.

10. The photomask blank according to claim 1, wherein:
the optical density per unit film thickness of the back-surface antireflection layer is 0.03 to 0.04 $nm^{-1}$; and
the optical density per unit film thickness of the light-shielding layer is 0.05 to 0.06 $nm^{-1}$.

11. The photomask blank according to claim 1, wherein:
in the back-surface antireflection layer, the metal content is 25 to 50 atomic %, the sum of the content of N and the content of O is 35 to 65 atomic %, and the optical density is 1.1 to 1.3;
the light-shielding layer comprises the metal and N, wherein the metal content is 50 to 90 atomic %, the thickness is 2 to 6 nm, and the optical density is 0.1 to 0.3; and
in the front-surface antireflection layer, the metal content is 25 to 50 atomic %, the sum of the content of N and the content of O is 45 to 65 atomic %, and the optical density is 0.4 to 0.6.

12. The photomask blank according to claim 1, wherein:
in the back-surface antireflection layer, the content of Cr is 30 to 40 atomic %, the sum of the content of N and the content of O is 40 to 55 atomic %, and the optical density is 1.1 to 1.3;
in the light-shielding layer, the content of Cr is 50 to 90 atomic %, the content of N is 3 to 25 atomic %, and the optical density is 0.1 to 0.3; and
in the front-surface antireflection layer, the content of Cr is 30 to 40 atomic %, the sum of the content of N and the content of O is 50 to 60 atomic %, and the optical density is 0.4 to 0.6.

13. The photomask blank according to claim 1, wherein the etching rates of the back-surface antireflection layer, the light-shielding layer and the front-surface antireflection layer have the following relationship:

$$\text{Second etching rate} < \text{First etching rate} \leq \text{Third etching rate}.$$

14. The photomask blank according to claim 1, wherein:
a phase shifter film is provided between the light transmissive substrate and the light-shielding film; and
the thickness of the entire light-shielding film is 50 nm or less.

15. A photomask, which is produced using the photomask blank according to claim 1.

* * * * *